(12) United States Patent
Waldemer et al.

(10) Patent No.: US 12,176,147 B2
(45) Date of Patent: Dec. 24, 2024

(54) THREE-DIMENSIONAL CAPACITORS WITH DOUBLE METAL ELECTRODES

(71) Applicant: Intel Corporation, Santa Clara, CA (US)

(72) Inventors: James D. Waldemer, Hillsboro, OR (US); Matthieu Giraud-Carrier, Hillsboro, OR (US); Bernhard Sell, Portland, OR (US); Travis W. Lajoie, Forest Grove, OR (US); Wilfred Gomes, Portland, OR (US); Abhishek A. Sharma, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 672 days.

(21) Appl. No.: 17/357,385

(22) Filed: Jun. 24, 2021

(65) Prior Publication Data
US 2022/0415573 A1   Dec. 29, 2022

(51) Int. Cl.
*H01G 4/30*   (2006.01)
*H01G 4/005*   (2006.01)
*H01G 4/40*   (2006.01)

(52) U.S. Cl.
CPC ............... *H01G 4/005* (2013.01); *H01G 4/30* (2013.01); *H01G 4/40* (2013.01)

(58) Field of Classification Search
CPC ............. H01G 4/005; H01G 4/30; H01G 4/40
USPC .......................................................... 361/782
See application file for complete search history.

(56) References Cited

U.S. PATENT DOCUMENTS

| | | | |
|---|---|---|---|
| 2012/0211865 A1* | 8/2012 | Tian | H01L 27/0805 |
| | | | 257/532 |
| 2017/0104057 A1 | 4/2017 | Voiron | |
| 2021/0125990 A1 | 4/2021 | Gomes et al. | |
| 2021/0134802 A1 | 5/2021 | Gomes et al. | |

(Continued)

FOREIGN PATENT DOCUMENTS

EP   3758062 A1   12/2020

OTHER PUBLICATIONS

U.S. Appl. No. 16/667,740, filed Oct. 29, 2019, Thin Film Transistor Based Memory Cells on Both Sides of a Layer of Logic Devices.

(Continued)

*Primary Examiner* — Binh B Tran
(74) *Attorney, Agent, or Firm* — Akona IP PC

(57) ABSTRACT

Disclosed herein are IC structures with three-dimensional capacitors with double metal electrodes provided in a support structure (e.g., a substrate, a die, a wafer, or a chip). An example three-dimensional capacitor includes first and second capacitor electrodes and a capacitor insulator between them. Each capacitor electrode includes a planar portion extending across the support structure and one or more via portions extending into one or more via openings in the support structure. The capacitor insulator also includes a planar portion and a via portion extending into the via opening(s). The planar portion of the capacitor electrodes are thicker than the via portions. Each capacitor electrode may be deposited using two deposition processes, such as a conformal deposition process for depositing the via portion of the electrode, and a sputter process for depositing the planar portion of the electrode.

20 Claims, 21 Drawing Sheets

(56) References Cited

U.S. PATENT DOCUMENTS

2021/0151438 A1    5/2021  Gomes et al.
2021/0202761 A1*   7/2021  Cheng .................... H01L 28/92

OTHER PUBLICATIONS

U.S. Appl. No. 16/669,599, filed Oct. 31, 2019, Transistors With Back-Side Contacts to Create Three Dimensional Memory and Logic.
U.S. Appl. No. 16/689,789, filed Nov. 20, 2019, Three-Dimensional Memory Arrays With Layer Selector Transistors.
U.S. Appl. No. 16/724,691, filed Dec. 23, 2019, Dense Memory Arrays Utilizing Access Transistors With Back-Side Contacts.
U.S. Appl. No. 17/170,951, filed Feb. 9, 2021, Decoupling Capacitors Based on Dummy Through-Silicon-Via Plates.
Extended European Search Report in EP Patent Application No. 22175152.2 dated Nov. 7, 2022, 10 pages.

* cited by examiner

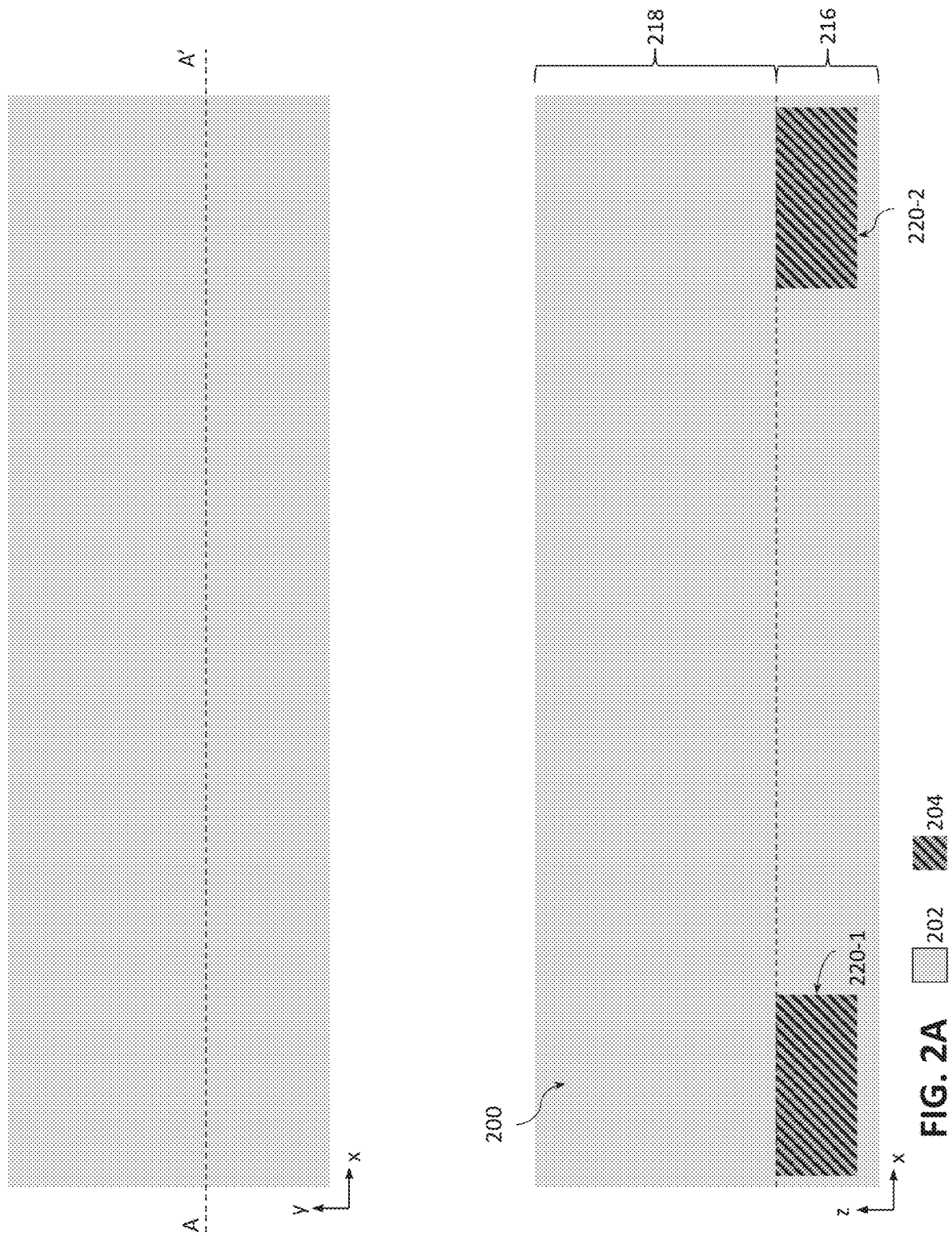

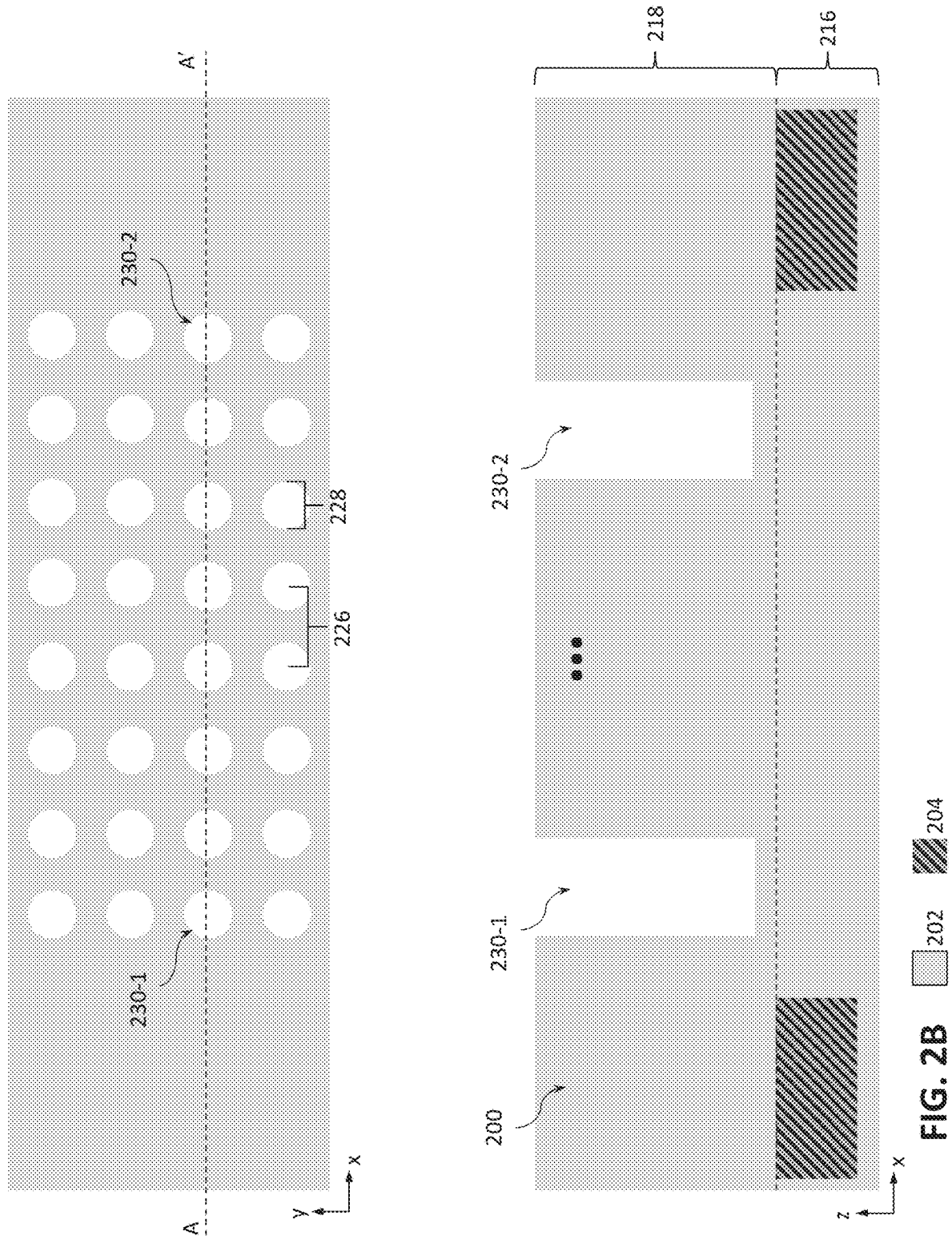

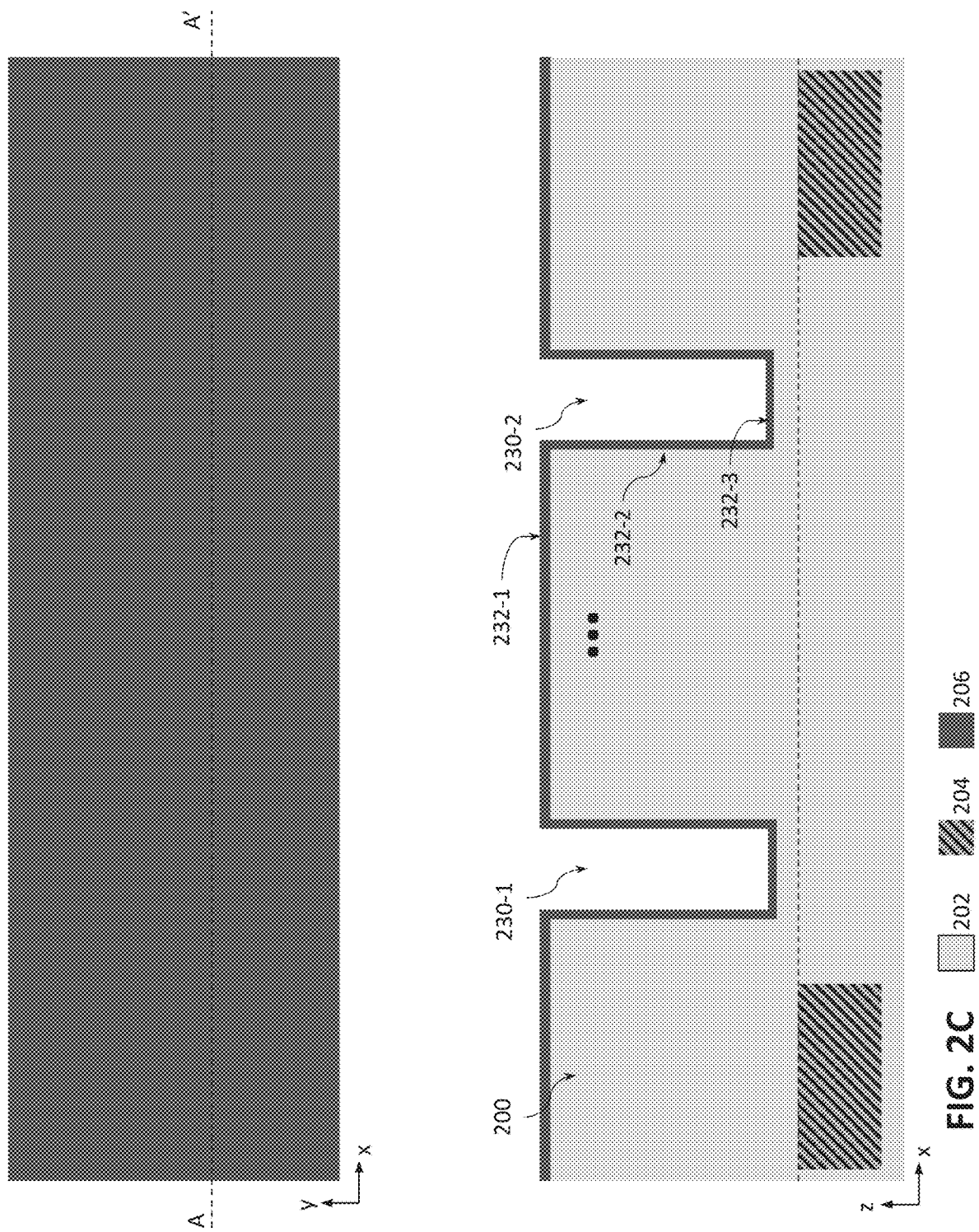

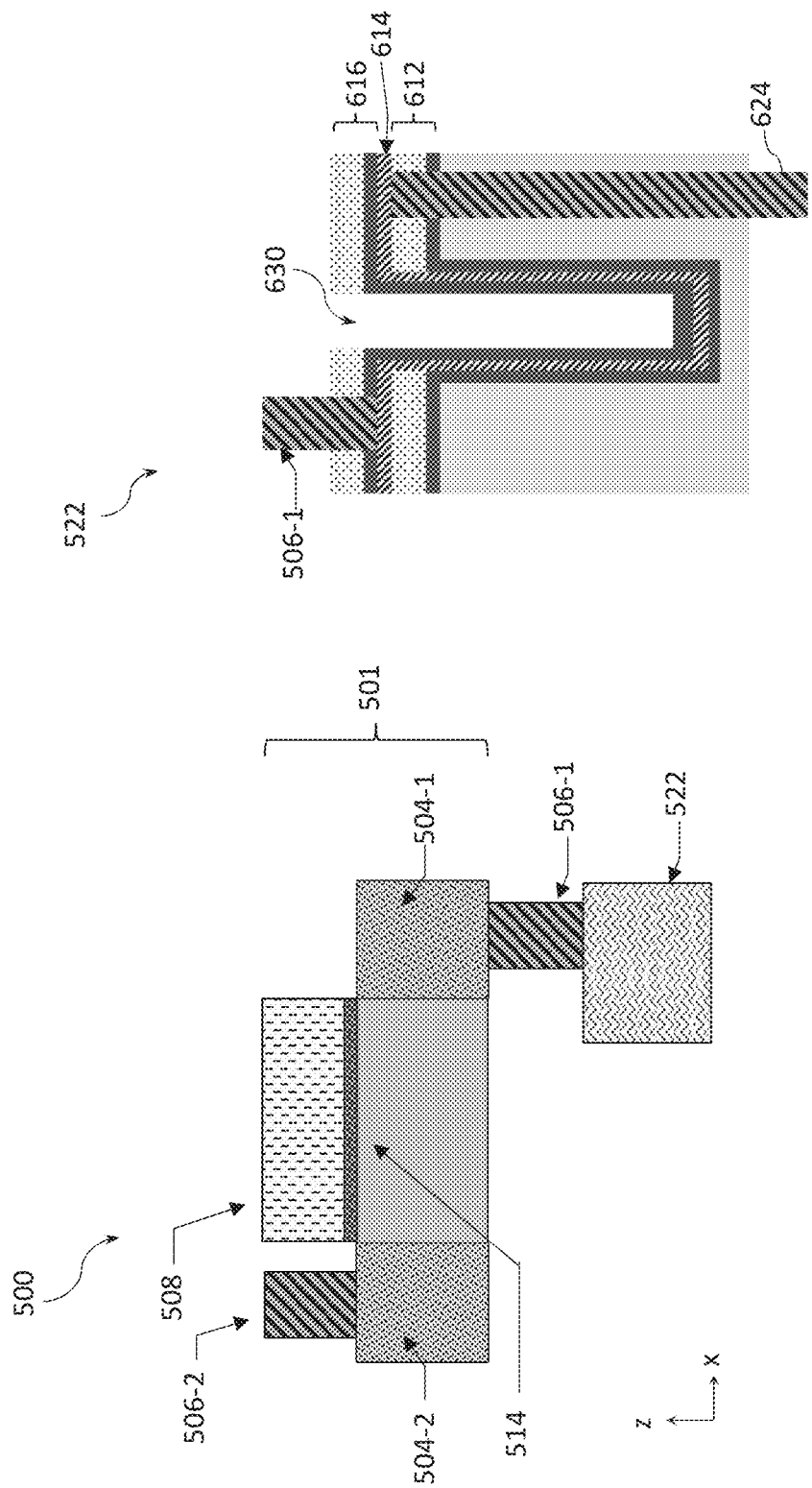
FIG. 6
FIG. 5

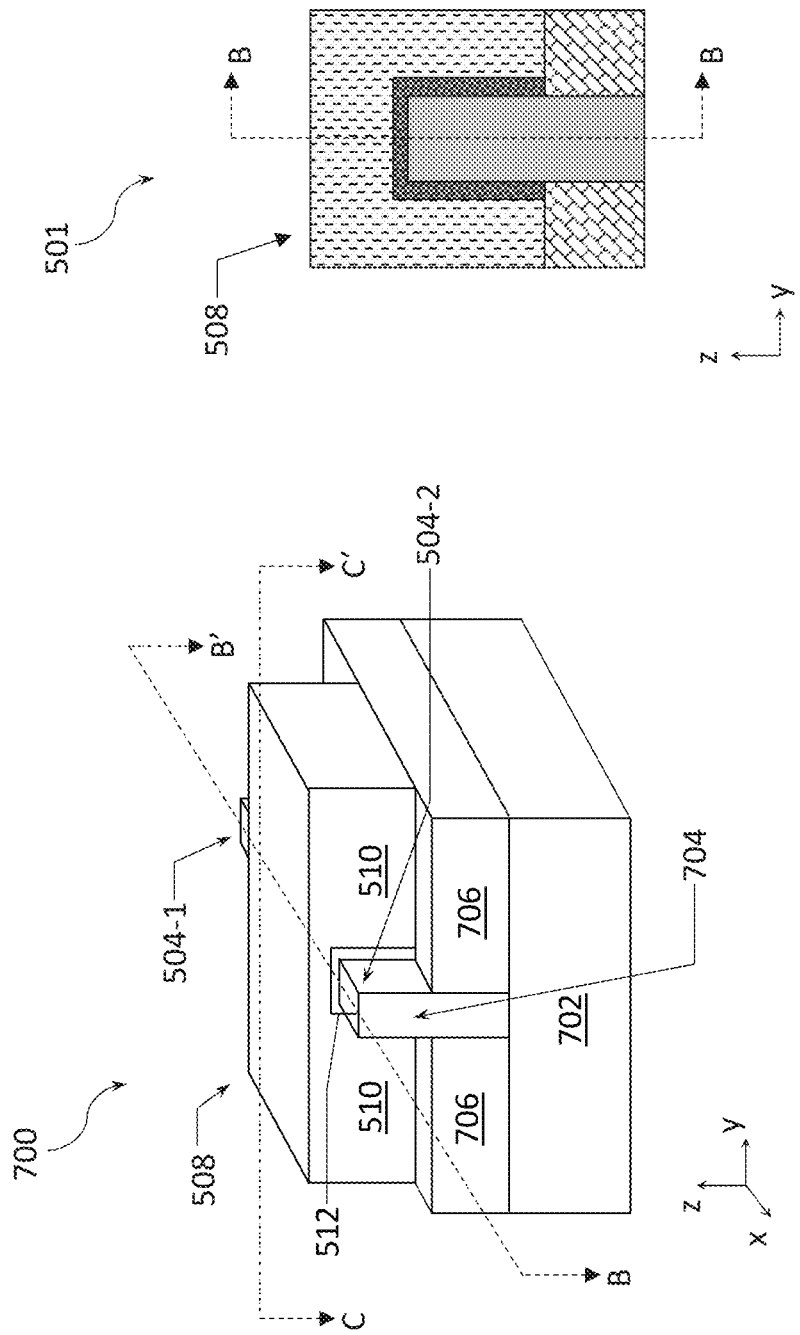
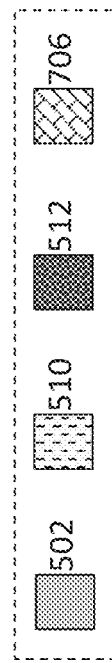
FIG. 7B
FIG. 7A

THREE-DIMENSIONAL CAPACITORS WITH DOUBLE METAL ELECTRODES

TECHNICAL FIELD

This disclosure relates generally to the field of integrated circuit (IC) structures and devices, and more specifically, to three-dimensional capacitors with double metal electrodes integrated in such IC structures and devices.

BACKGROUND

A decoupling capacitor is a capacitor used to decouple one part of an electrical network from another, and it can be used as a local energy reservoir. Capacitors need time to charge and discharge, which opposes quick changes in voltage. Noise caused by other circuit elements can be shunted through the decoupling capacitor, reducing the effect the noise has on the rest of the circuit. When a decoupling capacitor is placed in a semiconductor package close to a power consuming circuit, it allows a direct current (DC) signal to pass through the circuit smoothly, filtering out voltage variation. The stored charge either dissipates or can be used as a local power supply to device inputs during signal switching stages.

Capacitors are created by sandwiching a dielectric material between two conductors, e.g., two metal plates. Capacitors can be designed to have larger capacitance by increasing the size of the capacitor, e.g., the area of the metal plates, or by selecting a dielectric with a higher permittivity. For decoupling capacitors and other use cases, such as memory cells, it is desirable to have a higher capacitance.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 2A-2K illustrate various stages in the manufacture of an example IC structure according to the method of FIG. 1, in accordance with some embodiments.

FIG. 5 provides a schematic illustration of a cross-sectional view of an example memory cell that includes any of the capacitors described herein, in accordance with some embodiments.

FIG. 6 illustrates an example three-dimensional capacitor with a double metal electrode and a back-side contact, in accordance with some embodiments.

FIGS. 7A and 7B are perspective and cross-sectional views, respectively, of an example transistor with a back-side contact implemented as a FinFET, in accordance with some embodiments.

DETAILED DESCRIPTION

Overview

Figure 1:
FIG. 1 is a flow diagram of an example method for fabricating a three-dimensional capacitor with double metal electrodes, in accordance with some embodiments.

The systems, methods and devices of this disclosure each have several innovative aspects, no single one of which is solely responsible for all desirable attributes disclosed herein. Details of one or more implementations of the subject matter described in this specification are set forth in the description below and the accompanying drawings.

Disclosed herein are IC structures (e.g., IC devices) with one or more three-dimensional capacitors with double metal electrodes provided in a support structure (e.g., a substrate, a die, a wafer, or a chip) of an IC structure. The support structure has two faces on opposite sides, e.g., a top face and a bottom face. An example capacitor includes first and second capacitor electrodes and a capacitor insulator between them. The capacitor electrodes may be double metal electrodes, which consist of two metal layers. To form three-dimensional capacitors, one or more openings are formed in a top face of the support structure. The openings extend partway through the support structure, with the support structure forming sidewalls and the base of the openings. A first two-layer capacitor electrode is formed over the support structure, with a first layer lining the opening(s), and a second layer along a top face of the support structure. A second two-layer capacitor electrode also includes a first layer in the opening(s), and a second layer along the top face of the support structure and over the first capacitor electrode. The capacitor further includes a capacitor insulator between the two capacitor electrodes. The capacitor insulator extends into the opening(s) and along the top face of the support structure.

In the first capacitor electrode, the first layer formed within the openings may have a thickness between 1 nm and 5 nm. The second layer along the top face of the support structure is thicker than the first layer. For example, the second layer may have a thickness between 10 nm and 100 nm. The first and second layers may be deposited using different deposition methods, e.g., the first layer is formed using a conformal deposition method that deposits a layer on any exposed surface, including surfaces within the openings, and the second layer is formed using a different method that deposits a layer on horizontal surfaces, but does not reach into the openings. Similarly, in the second capacitor electrode, the first layer is thinner than the second layer, and the two layers may be deposited using different deposition methods, e.g., the same deposition methods used to deposit the first capacitor electrode. For example, the first layer of the second electrode may have a thickness between 1 nm and 5 nm, and the second layer of the second electrode may have a thickness between 10 nm and 100 nm. The insulator may have a similar thickness to the first electrode layers, e.g., between 1 nm and 5 nm, and is deposited using a conformal deposition method.

In some embodiments, a single opening and a surrounding area of the plate form a single capacitor. For example, a series of capacitors each including a capacitor formed within and above a single opening may be used to form a set of memory cells. Each capacitor can be coupled to a transistor, forming a 1T-1C memory cell. In other embodiments, multiple openings (e.g., two, three, four, or more openings) are connected together by the electrode plates to form a single capacitor. For example, a memory cell includes a transistor coupled to a capacitor that includes electrodes formed within a set of electrically connected openings.

Larger capacitors can be formed by electrodes that extend across and into many openings. For example, an array of openings is formed across the support structure, and a single capacitor is formed over the support structure, with the electrodes extending into the openings. A capacitor formed across a large portion of the substrate can be used as a decoupling capacitor. For example, if an IC package includes a decoupling capacitor, the decoupling capacitor may extend across an area that is 80% or 90% of the area of the IC package.

IC structures as described herein, in particular IC structures with three-dimensional capacitors with double metal electrodes as described herein, may be used for providing electrical connectivity to one or more components associated with an IC or/and between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

For purposes of explanation, specific numbers, materials and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well-known features are omitted or simplified in order not to obscure the illustrative implementations.

Further, references are made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, if a collection of drawings designated with different letters are present, e.g., FIGS. 2A-2K, such a collection may be referred to herein without the letters, e.g., as "FIG. 2."

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges.

The description uses the phrases "in an embodiment" or "in embodiments," which may each refer to one or more of the same or different embodiments. The terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

In the following detailed description, various aspects of the illustrative implementations will be described using terms commonly employed by those skilled in the art to convey the substance of their work to others skilled in the art. For example, as used herein, a "high-k dielectric" refers to a material having a higher dielectric constant than silicon oxide while a "low-k dielectric" refers to a material having a lower dielectric constant than silicon oxide. The terms "substantially," "close," "approximately," "near," and "about," generally refer to being within +/−20% of a target value based on the context of a particular value as described herein or as known in the art.

Fabricating IC Structures with Three-Dimensional Capacitors with Double Metal Electrodes FIG. 1 is a flow diagram of an example method 100 for fabricating a three-dimensional capacitor with double metal electrodes, in accordance with some embodiments. FIGS. 2A-2K illustrate top-down and cross-sectional side views for various stages in the manufacture of an example IC structure according to the fabrication method 100, in accordance with some embodiments. In particular, each of FIGS. 2A-2K shows, at the top of the page of the drawing, a top-down view (i.e., a view in a x-y plane) of the IC structure and, at the bottom of the page of the drawing, a cross-section side view of the IC structure with the cross-section taken along an x-z plane AA' of the reference coordinate system x-y-z shown in FIGS. 2A-2K. Note that the scales of the top-down views and cross-section side views differ; the cross-section side view is shown at a larger, zoomed in scale to illustrate the capacitor structure within two example openings.

A number of elements referred to in the description of FIGS. 2A-2K with reference numerals are illustrated in these figures with different patterns, with a legend showing the correspondence between the reference numerals and patterns being provided at the bottom of each drawing page containing FIGS. 2A-K. For example, the legend illustrates that FIGS. 2A-2K use different patterns to show a first insulator material 202, a first electrically conductive material 204, a second electrically conductive material 206, a third electrically conductive material 208, and a second insulator material 210. Furthermore, although a certain number of a given element may be illustrated in some of FIGS. 2A-2K (e.g., 32 openings in the support structure in FIG. 2B), this is simply for ease of illustration, and more, or less, than that number may be included in an IC structure according to various embodiments of the present disclosure. Still further, various IC structure views shown in FIGS. 2A-2K are intended to show relative arrangements of various elements therein, and that various IC structures, or portions thereof, may include other elements or components that are not illustrated (e.g., transistor portions, various components that may be in electrical contact with the capacitor or contacts, etc.).

Turning to FIG. 1, the method 100 may begin with a process 102 that includes depositing an insulator material to form a support structure. The support structure 200, depicted in FIG. 2A, illustrates an example result of the process 102. As shown in FIG. 2A, the support structure 200 includes first layer 216 and a second layer 218 deposited over a first layer 216. The support structure 200 has a top face, e.g., the face shown in the top-view, and a bottom face opposite the top face, e.g., the face at the base of the first layer 216.

The first layer 216 includes an interconnect structure 220 that includes a first electrically conductive material 204 deposited in the first insulator material 202. The first insulator material 202 may include, e.g., silicon oxide, carbon-doped silicon oxide, silicon carbide, silicon nitride, aluminum oxide, and/or silicon oxynitride. The first layer 216 may be deposited over another layer (not shown), e.g., a substrate. The first layer 216 of the first insulator material 202 may be deposited by spin-coating, dip-coating, chemical vapor deposition (CVD), atomic layer deposition (ALD), or any combination of these techniques. Alternatively, the first layer 216 may include the substrate or a portion of the substrate.

Two interconnect regions 220-1 and 220-2 are shown in in the first layer 216. The interconnect structure 220 may be deposited using any suitable processes for providing electrically conductive materials, e.g., ALD, CVD, physical vapor deposition (PVD), or electroplating. The first conductive material 204 may include one or more metals or metal alloys, with materials such as copper, ruthenium, palladium, platinum, cobalt, nickel, hafnium, zirconium, titanium, tantalum, and aluminum, tantalum nitride, tungsten, doped silicon, doped germanium, or alloys and mixtures of any of these. In some embodiments, the first conductive material 204 may include one or more electrically conductive alloys, oxides, or carbides of one or more metals. In some embodiments, the first conductive material 204 may include a doped semiconductor, such as silicon or another semiconductor doped with an N-type dopant or a P-type dopant. Metals may provide higher conductivity, while doped semiconductors may be easier to pattern during fabrication. In some embodiments, the material composition of the first interconnect region 220-1 may be different from the material composition of the second interconnect region 220-2.

The second layer 218 is a second layer of the first insulator material 202 deposited over the first layer 216. The second layer 218 of the first insulator material 202 may be deposited by spin-coating, dip-coating, CVD, ALD, or any combination of these techniques. In this example, first layer 216 and the second layer 218 are formed of the same insulator material 202. In other embodiments, the first layer 216 in which the interconnect structure 220 is formed and the second layer 218 may comprise different materials.

In general, implementations of the disclosure may be formed or carried out on a substrate, such as a semiconductor substrate composed of semiconductor material systems including, for example, N-type or P-type materials systems. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V, group II-VI, or group IV materials. Although a few examples of materials from which the substrate may be formed are described here, any material that may serve as a foundation upon which an IC may be built falls within the spirit and scope of the present disclosure. In various embodiments, the support structure 200 may include any such substrate, possibly with some layers and/or devices, including the layer 216, or the layers 216 and 218, already formed thereon, providing a suitable surface for forming the three-dimensional capacitor with double metal electrodes, as described herein.

The method 100 may then proceed with a process 104 that includes forming an array of via openings in the first insulator material 202. A result of this process is illustrated in FIG. 2B, showing an array of via openings 230, also referred to as openings 230 or vias 230, formed in the support structure 200 in the process 104.

Figure 2D:
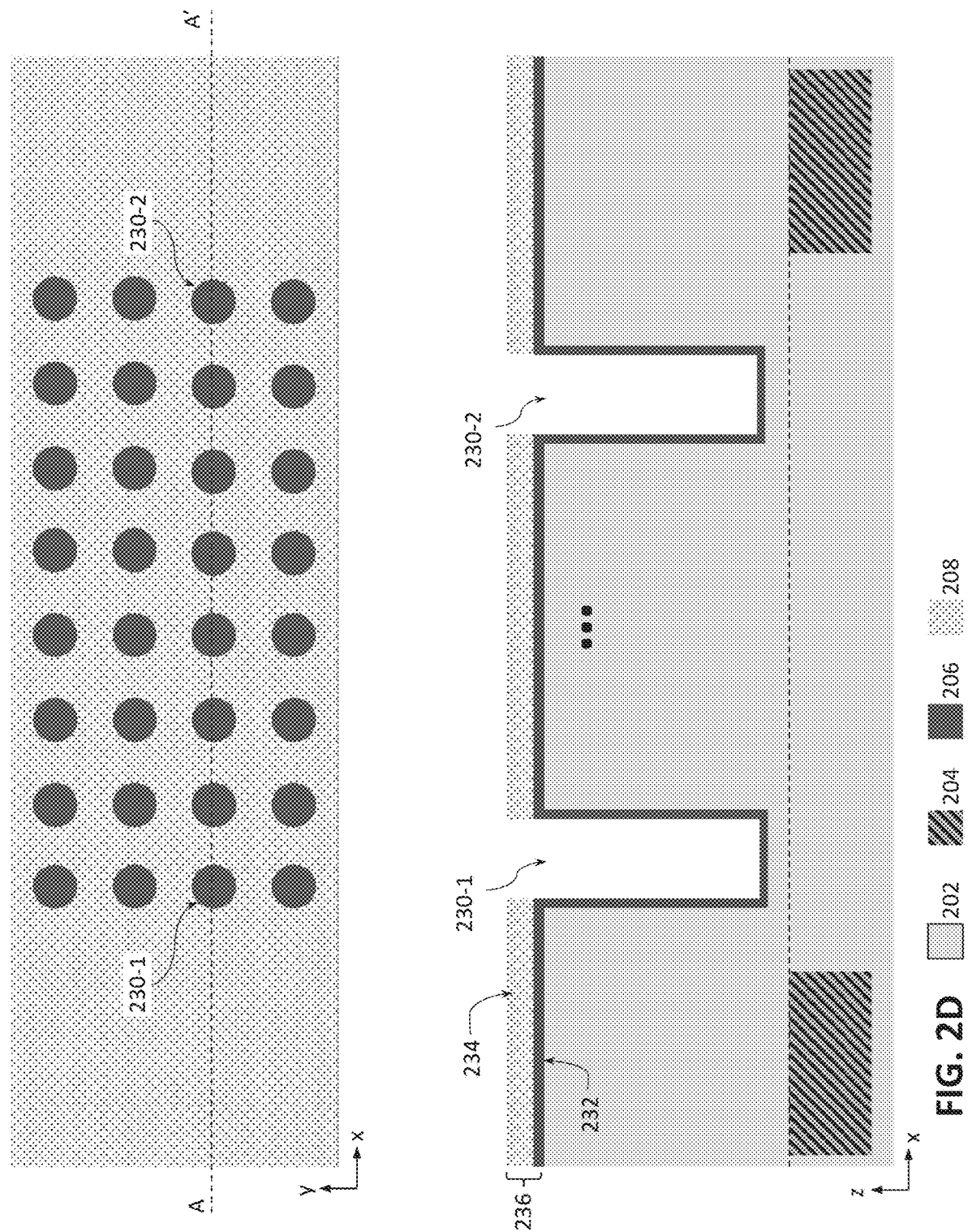

As shown in FIG. 2B, openings 230, including opening 230-1 and 230-2, extend into a top face of the support structure 200. The openings 230 extend from the top face of the support structure 200 towards the bottom face of the support structure 200, i.e., towards the bottom face of the first layer 216. While the via openings 230 are white in the top-down view in FIG. 2B, this is merely to illustrate the position of the openings 230, and the openings 230 do not extend through the full support structure 200. Although FIG. 2B and subsequent FIGS. 2C-2K illustrate an embodiment with 32 openings 230, this is simply for ease of illustration, and more, or less, than that number may be included according to various embodiments of the present disclosure.

Although not specifically shown in the present drawings, any suitable processes may be used in the process 104 to form the openings 230, e.g., any suitable lithographic process in combination with a suitable etching process. In various embodiments, suitable lithographic processes may include photolithography, electron-beam lithography, etc., which may be used to define locations and dimensions for the openings 230. In various embodiments, suitable etching processes may include dry etch, wet etch, etc., which may be used to remove portions of the support structure 200 in regions defined by the lithographic process to form the openings 230. For example, any suitable anisotropic etch process, e.g., a dry etch, may be used in the process 104 to etch the support structure 200 through the openings defined by the lithographic process (e.g., openings defined in a photoresist material, not shown in FIG. 2B) to form the openings 230. In some embodiments, during the etch of the support structure 200 in the process 104, the IC structure may be heated to elevated temperatures, e.g., to temperatures between about room temperature and 200 degrees Celsius, including all values and ranges therein, to promote that byproducts of the etch are made sufficiently volatile to be removed from the surface.

In some embodiments, the width 228 (a dimension measured along the x-axis of the example coordinate system x-y-z shown in FIG. 2, also referred to the diameter) of the openings 230 may be between about 50 nanometers and 500 nanometers, including all values and ranges therein, e.g., about 100 nanometers.

In some embodiments, the pitch 226 of the openings 230 (i.e., center-to-center distance of adjacent openings 230) may be between about 50 nanometers and 500 nanometers, including all values and ranges therein, e.g., between about 100 nanometers and 150 nanometers. While the openings 230 are depicted in a square grid pattern in FIG. 2B, in other embodiments, the openings 230 may have a different pattern, e.g., a diamond grid pattern (e.g., a pattern turned 90° from the pattern shown in FIG. 2B), a rectangular grid (e.g., with the openings having a larger pitch in the x-direction and smaller pitch in the y-direction, or vice versa), or another pattern.

As noted above and illustrated in the cross-sectional side view, the openings 230 do not extend fully through the support structure 200, i.e., they do not extend to the bottom face of the support structure 200. In some embodiments, the depth (a dimension measured along the z-axis of the example coordinate system shown in FIG. 2) of the openings 230 may be between about 100 nanometers and 2000 nanometers, including all values and ranges therein, e.g., between 500 nanometers and 700 nanometers. Note that openings 230 are not drawn to scale, e.g., the openings may have a greater depth relative to their diameter than shown in FIG. 2. In the cross-sectional side view of FIG. 2B, the base of the openings 230 is above the first layer 216, so that the openings 230 are fully within the second layer 218. In some embodiments, an etch-stop material may be deposited between the first layer 216 and the second layer 218, preventing the openings 230 from extending into the first layer 216. In other embodiments, the openings 230 may extend through the second layer 218 and into the first layer 216.

The method 100 may then proceed with a process 106 that includes conformally depositing a first layer of an electrically conductive material into the via openings formed in the process 104. A result of this is illustrated in FIG. 2C, showing a first conductive layer 232 of a second conductive material 206 deposited into the openings 230 formed in the process 104. In some embodiments of the process 106, including the example shown in FIG. 2C, the second conductive material 206 is also deposited along the top face of the support structure 200. In some embodiments of the process 106, the first conductive layer 232 may be deposited over the top face of the support structure, sidewalls, and bases of the openings 230. For example, the first conductive layer 232 includes portions 232-2 and 232-3 that extend, respectively, along a sidewall and along a base of the via opening 230-2. The first conductive layer 232 also includes a planar portion 232-1 that extends along the top face of the support structure 200. In some embodiments, a thickness of the first conductive layer 232 may be between about 1 and 5 nanometers, including all values and ranges therein, e.g., about 3 nanometers.

The first conductive layer 232 may be deposited using any suitable technique for conformally depositing materials into the openings 230, such as ALD. Conformal deposition generally refers to deposition of a certain coating on any exposed surface of a given structure. A conformal coating may, therefore, be understood as a coating that is applied to exposed surfaces of a given structure, and not, for example, just to the horizontal surfaces. The second conductive material 206 deposited in the process 106 may include one or more of any suitable electrically conductive materials (conductors). Such materials may include any suitable electrically conductive material, alloy, or a stack of multiple electrically conductive materials. In some embodiments, the second conductive material 206 may include one or more metals or metal alloys, with metals such as copper, ruthenium, palladium, platinum, cobalt, nickel, hafnium, zirconium, titanium, tantalum, and aluminum. In some embodiments, the second conductive material 206 may include one or more electrically conductive alloys, oxides (e.g., conductive metal oxides), carbides (e.g., hafnium carbide, zirconium carbide, titanium carbide, tantalum carbide, and aluminum carbide, tungsten, tungsten carbide), or nitrides (e.g., hafnium nitride, zirconium nitride, titanium nitride, tantalum nitride, and aluminum nitride) of one or more metals. While the second conductive material 206 and first conductive material 204 are represented as different conductive materials with different shadings in FIGS. 2C-2K, in some embodiments, the same material or combination of materials are used for the second conductive material 206 and the first conductive material 204.

The method 100 may then proceed with a process 108 that includes depositing a second layer of an electrically conductive material over the top face of the support structure. A result of this is illustrated in FIG. 2D, showing a second conductive layer 234 of a third conductive material 208 layered over the first conductive layer 232. The second conductive layer 234 is in physical and electrical contact with the first conductive layer 232, and in particular, the second conductive layer 234 is in physical contact and deposited over the planar portion of the first conductive layer 232. The second conductive layer 234 is not deposited into the openings 230; as shown in the top-down view in FIG. 2D, the second conductive layer 234 is formed around the openings 230.

The first conductive layer 232 and the second conductive layer 234 are a first capacitor electrode 236. If the first conductive layer 232 and second conductive layer 234 are metal, the first capacitor electrode 236 may be referred to as a double metal electrode. The portion of the first conductive layer 232 within the openings 230 may be considered a first portion of the first capacitor electrode 236, referred to as a via portion or via portions, and the planar portion of the first conductive layer 232 and the second conductive layer 234 may be jointly considered a second portion, referred to as a planar portion. In some embodiments, the order of the first and second conductive layers 232 and 234 may be reversed, with the second, thicker conductive layer 234 deposited first, and the first, thinner conductive layer 232 deposited over the second conductive layer 232.

The first conductive layer 232 is thinner than the second conductive layer 234. In some embodiments, a thickness of the second conductive layer 234 may be between about 10 and 100 nanometers, including all values and ranges therein, e.g., between about 30 and 40 nanometers.

The second conductive layer 234 may be deposited using any suitable technique for depositing materials along a surface without filling the openings 230, such as PVD processes such as magnetron sputtering. The third conductive material 208 deposited in the process 108 may include one or more of any suitable electrically conductive materials (conductors), such as the materials described above with respect to the second conductive material 206. While the second conductive material 206 and third conductive material 208 are represented as different conductive materials with different shadings in FIGS. 2D-2K, in some embodiments, the same material or combination of materials are used for the second conductive material 206 and the third conductive material 208.

Figure 2E:
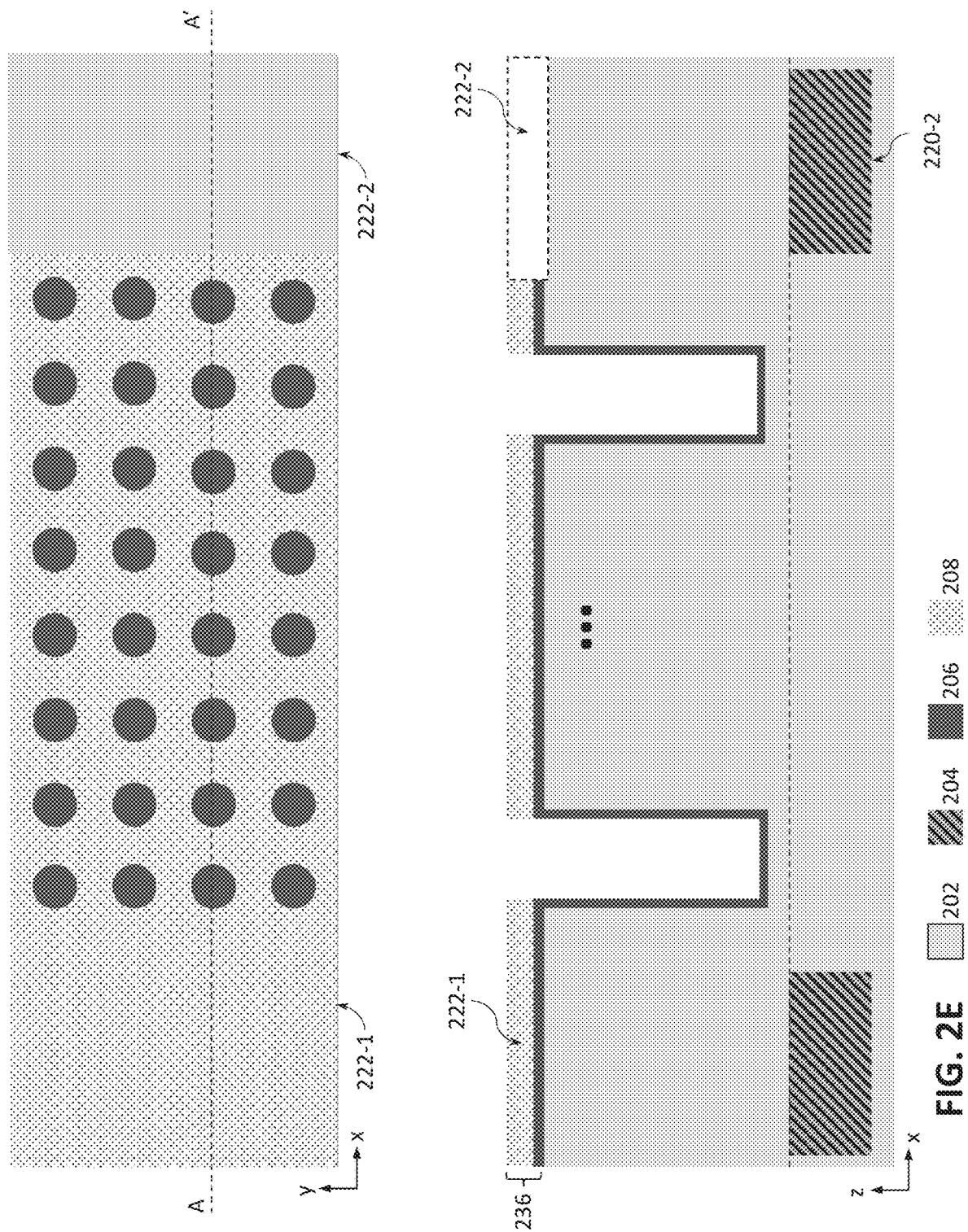

The method 100 may then proceed with a process 110 that includes patterning a first capacitor electrode contact. A result of this process is illustrated in FIG. 2E. As discussed further below, a second electrode is formed above the first capacitor electrode 236, and each electrode is coupled to a respective contact, e.g., a first via coupling the first capacitor electrode 236 to the first interconnect region 220-1, and a second via coupling the second capacitor electrode to the second interconnect region 220-2. To prevent the first capacitor electrode 236 from being connected to the second interconnect region 220-2, a portion 222-2 of the first capacitor electrode 236 is removed, leaving the portion of the first capacitor electrode 236 within and surrounding the openings 230, as well as a portion 222-1 over the first interconnect region 220-1. The removed portion 222-2 is illustrated with a dashed box in the cross-sectional side view of FIG. 2E. For example, the first capacitor electrode 236 may be patterned and the portion 222-2 etched away, leaving the top face of the support structure 200 exposed, as illustrated in the top-down view.

Figure 2F:
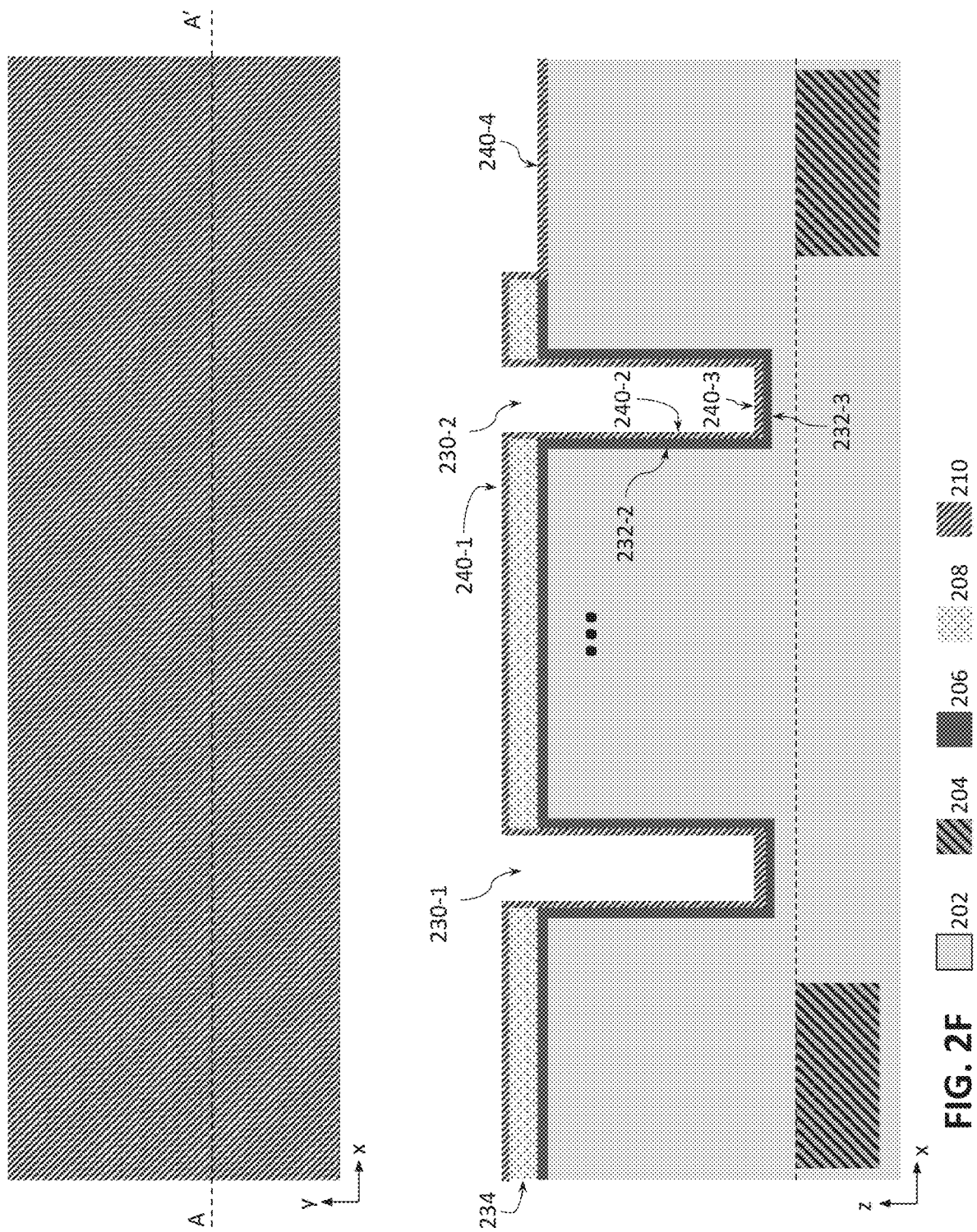

The method 100 may then proceed with a process 112 that includes conformally depositing a layer of an insulator material over the first capacitor electrode 236. A result of this is illustrated in FIG. 2F, showing an insulator layer 240 of a second insulator material 210 deposited over the capacitor electrode 236, including into the openings 230. For example, the insulator layer 240 includes a planar portion 240-1 that extends along the top face of the support structure 200 and layered over the second conductive layer 234. The insulator layer 240 further includes a sidewall portion 240-2 that extends along the sidewall portion 232-2 of the first conductive layer 232, and a base portion 240-3 that extends along the base portion 232-3 of the first conductive layer 232. The portions of the insulator layer 240 that are inside the openings 230 are nested within the portions of the first conductive layer 232 that are inside the openings 230. In this example, the insulator layer 240 further includes a fourth portion 240-4 that extends over the portion of the support structure 200 exposed during the process 110. The fourth portion 240-4 insulates the first capacitor electrode 236 from a second capacitor electrode, deposited in processes 114 and 116, and in some embodiments, the fourth portion 240-4 may not extend fully to the right side of the IC structure shown in FIG. 2F. In some embodiments, a thickness of the insulator layer 240 may be between about 1 and 5 nanometers, including all values and ranges therein, e.g., about 3 nanometers.

The insulator layer 240 may be deposited using any suitable technique for conformally depositing materials into the openings 230, such as ALD. In some embodiments, the second insulator material 210 may include any suitable material for acting as a capacitor insulator. Examples of such materials include, but are not limited to, dielectric materials known for their applicability in ICs, such as low-k dielectric materials. Examples of dielectric materials that may be used as the second insulator material 210 may include, but are not limited to, silicon dioxide (SiO2), carbon-doped oxide (CDO), silicon nitride, fluorosilicate glass (FSG), silicon nitride, and organosilicates such as silsesquioxane, siloxane, or organosilicate glass. In some embodiments, the second insulator material 210 may include organic polymers such as polyimide, polynorbornenes, benzocyclobutene, perfluorocyclobutane, or polytetrafluoroethylene (PTFE). Still other examples of low-k dielectric materials that may be used as the second insulator material 210 include silicon-based polymeric dielectrics such as hydrogen silsesquioxane (HSQ) and methylsilsesquioxane (MSQ).

Figure 2G:
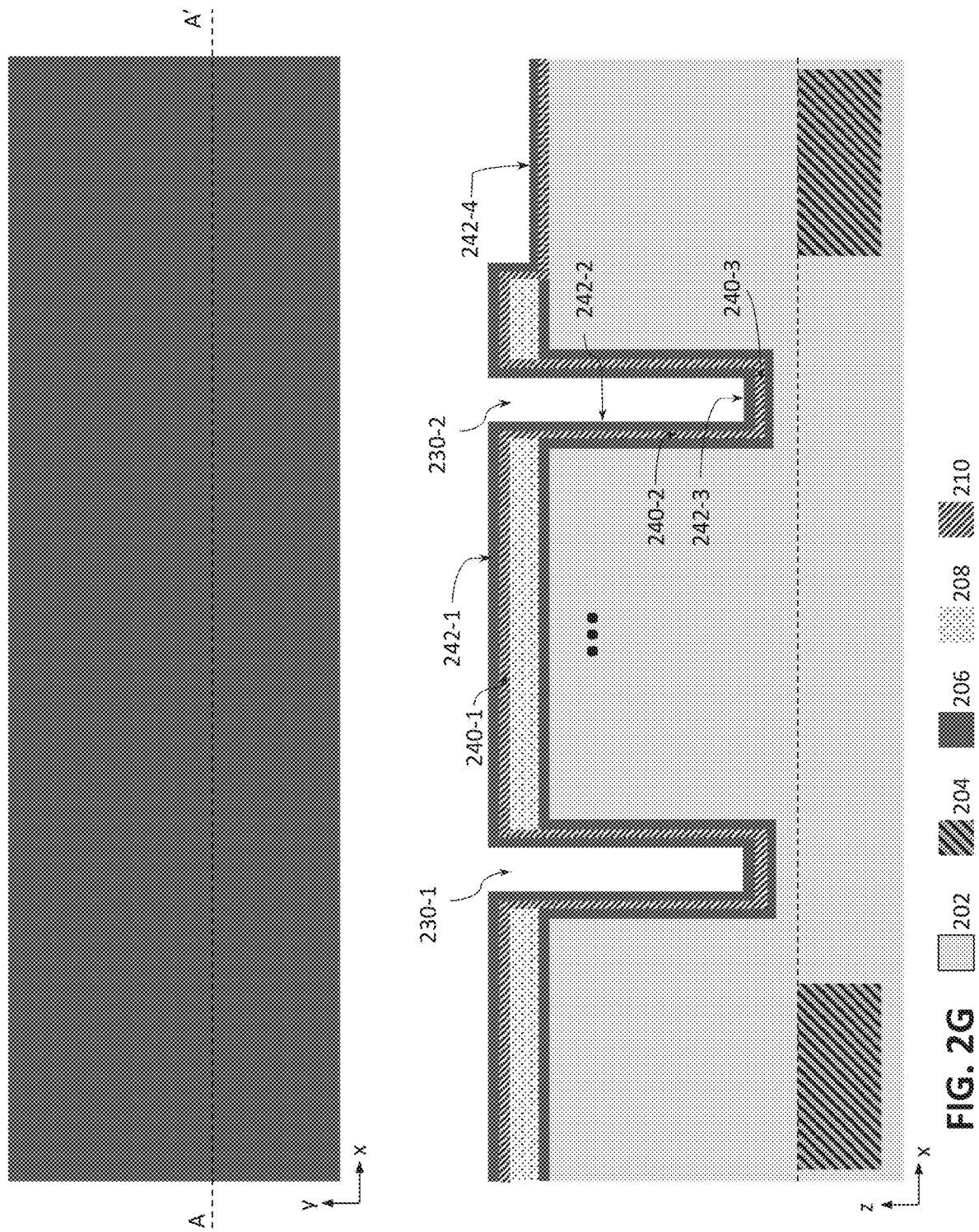

The method 100 may then proceed with a process 114 that includes conformally depositing a third layer of an electrically conductive material into the via openings. A result of this is illustrated in FIG. 2G, showing a third conductive layer 242 of the second conductive material 206 deposited over the insulator layer 240, and in particular, in the portions of the insulator layer 240 in the openings 230. In some embodiments of the process 114, including the example shown in FIG. 2G, the third conductive layer 242 is also deposited along the top face of the support structure 200. For example, the third conductive layer 242 includes a planar portion 242-1 that extends along the top face of the support structure 200 and layered over the planar portion 240-1 of the insulator layer 240. The third conductive layer 242 further includes a sidewall portion 242-2 that extends along the sidewall portion 240-2 of the insulator layer 240, and a base portion 242-3 that extends along the base portion 240-3 of the insulator layer 240. The portions of the third conductive layer 242 that are inside the openings 230 are nested within the portions of the insulator layer 240 that are inside the openings 230. The third conductive layer 242 further includes a contact portion 242-4 that extends over the fourth portion 240-4 of the insulator layer 240. If, as described above, the fourth portion 240-4 of the insulator layer 240 does not extend all the way to the right of the IC device, the contact portion 242-4 extends along any portion of the support structure 200 that remains exposed after process 112.

The third conductive layer 242 may be deposited using any suitable technique for conformally depositing materials into the openings 230, such as ALD. In some embodiments, a thickness of the third conductive layer 242 may be between about 1 and 5 nanometers, including all values and ranges therein, e.g., about 3 nanometers. The third conductive layer 242 may be the same thickness as the first conductive layer 232, or these layers may have different thicknesses. While the first and third conductive layers 232 and 242 are shown as being composed of the same second conductive material 206, in some embodiments, different materials or combinations of materials may be used for the first conductive layer 232 and the third conductive layer 242.

Figure 2H:
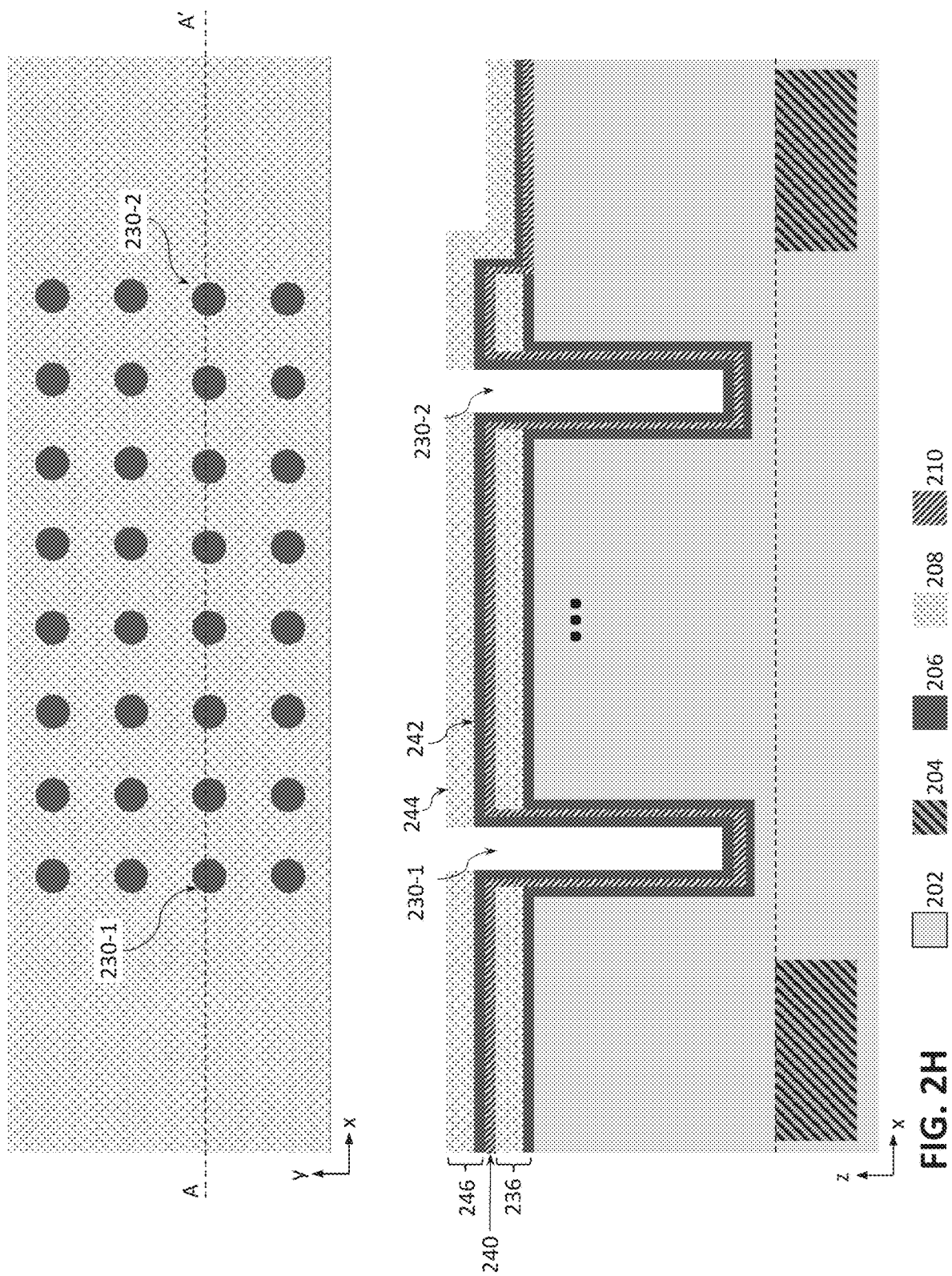

The method 100 may then proceed with a process 116 that includes depositing a fourth layer of an electrically conductive material over the top face of the support structure. A result of this process is illustrated in FIG. 2H, showing a fourth conductive layer 244 of the third conductive material 208 layered over the third conductive layer 242. The fourth conductive layer 244 is in physical and electrical contact with the fourth conductive layer 244, and in particular, the fourth conductive layer 244 is in physical contact and deposited over the planar portion of the third conductive layer 242. The fourth conductive layer 244 is not deposited into the openings 230; as shown in the top-down view in FIG. 2H, the fourth conductive layer 244 is formed around the openings 230.

The third conductive layer 242 and the fourth conductive layer 244 are a second capacitor electrode 246. If the third conductive layer 242 and fourth conductive layer 244 are metal, the second capacitor electrode 246 may be referred to as a double metal electrode. The portion of the third conductive layer 242 within the openings 230 may be considered a first portion of the second capacitor electrode 246, referred to as a via portion or via portions, and the planar portion of the third conductive layer 242 and the fourth conductive layer 244 may be jointly considered a second portion, referred to as a planar portion. In some embodiments, the order of the third and fourth conductive layers 242 and 244 may be reversed, with the fourth, thicker conductive layer 244 deposited first (i.e., on top of the insulator layer 240), and the third, thinner conductive layer 242 deposited over the fourth conductive layer 244.

The fourth conductive layer 244 may be deposited using any suitable technique for depositing materials along a surface without filling the openings 230, such as PVD processes such as magnetron sputtering. The third conductive layer 242 is thinner than the fourth conductive layer 244. In some embodiments, a thickness of the fourth conductive layer 244 may be between about 10 and 100 nanometers, including all values and ranges therein, e.g., between about 30 and 40 nanometers. The fourth conductive layer 244 may be the same thickness as the second conductive layer 234, or these layers may have different thicknesses. For example, the fourth conductive layer 244 may be thicker than the second conductive layer 234, e.g., the fourth conductive layer 244 is between about 40 and 60 nanometers, and the second conductive layer 234 is between about 30 and 40 nanometers. While the second and fourth conductive layers 234 and 244 are shown as being composed of the same third conductive material 208, in some embodiments, different materials or combinations of materials may be used for the second conductive layer 234 and the fourth conductive layer 244.

Figure 2I:
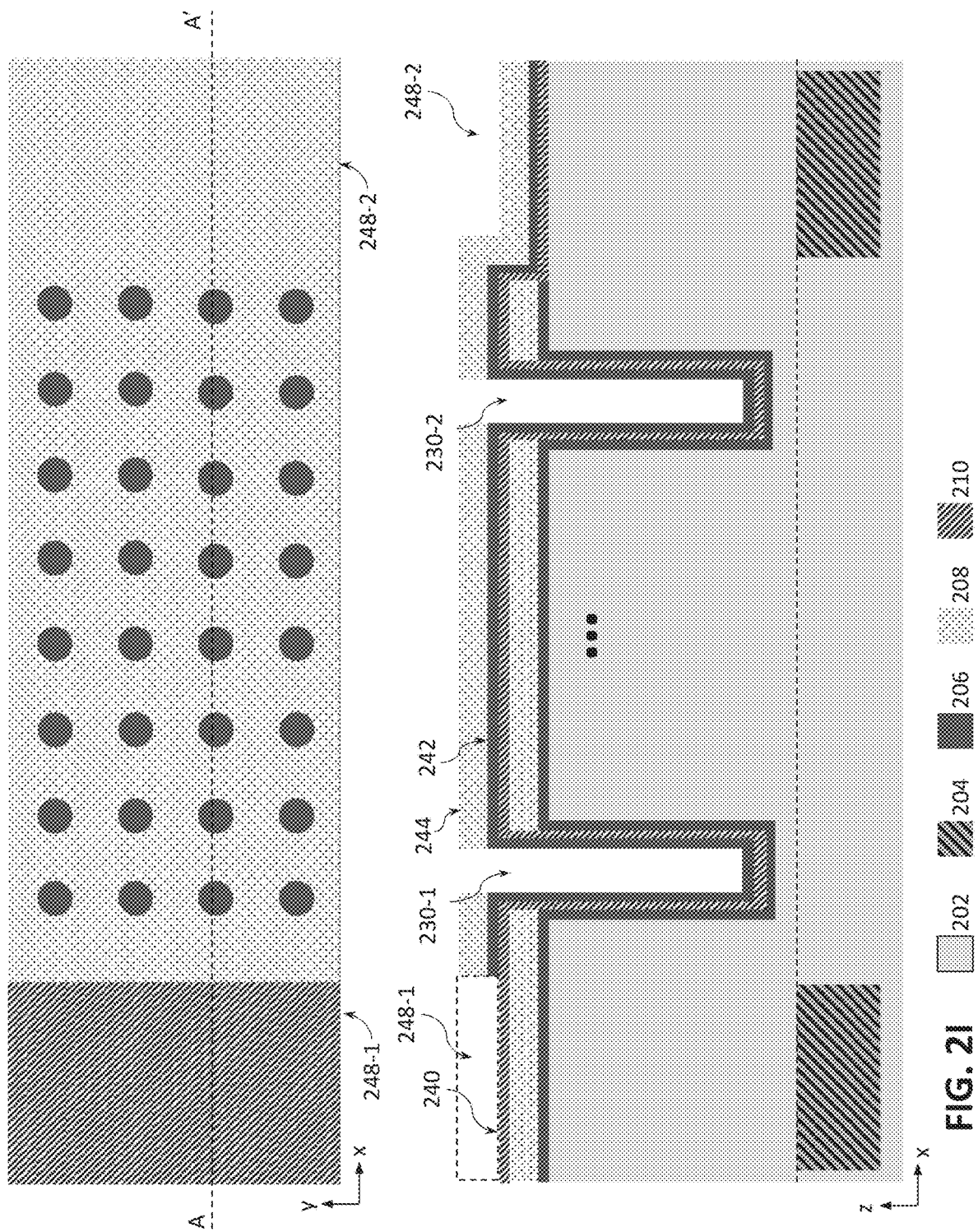
Figure 2J:
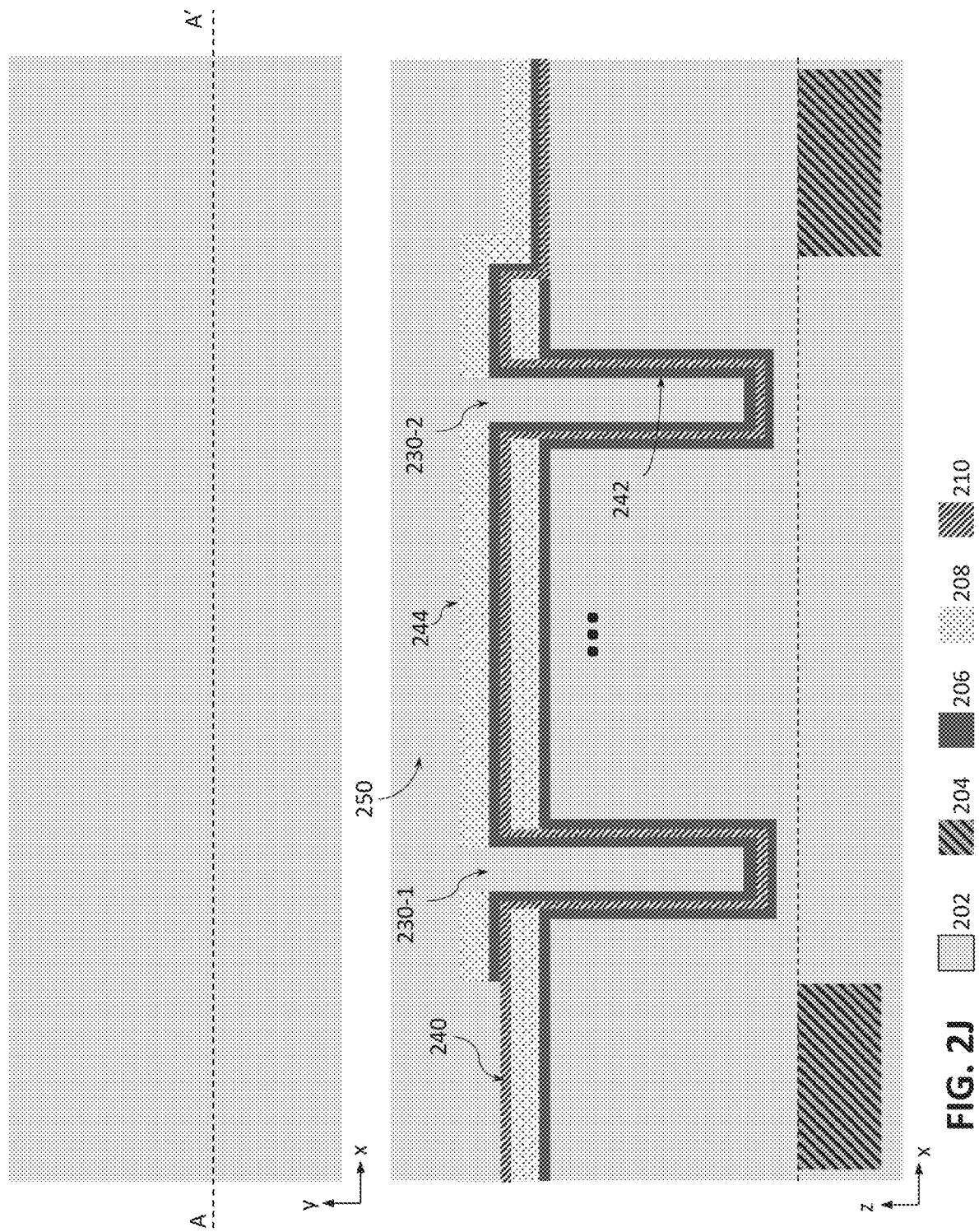
Figure 2K:
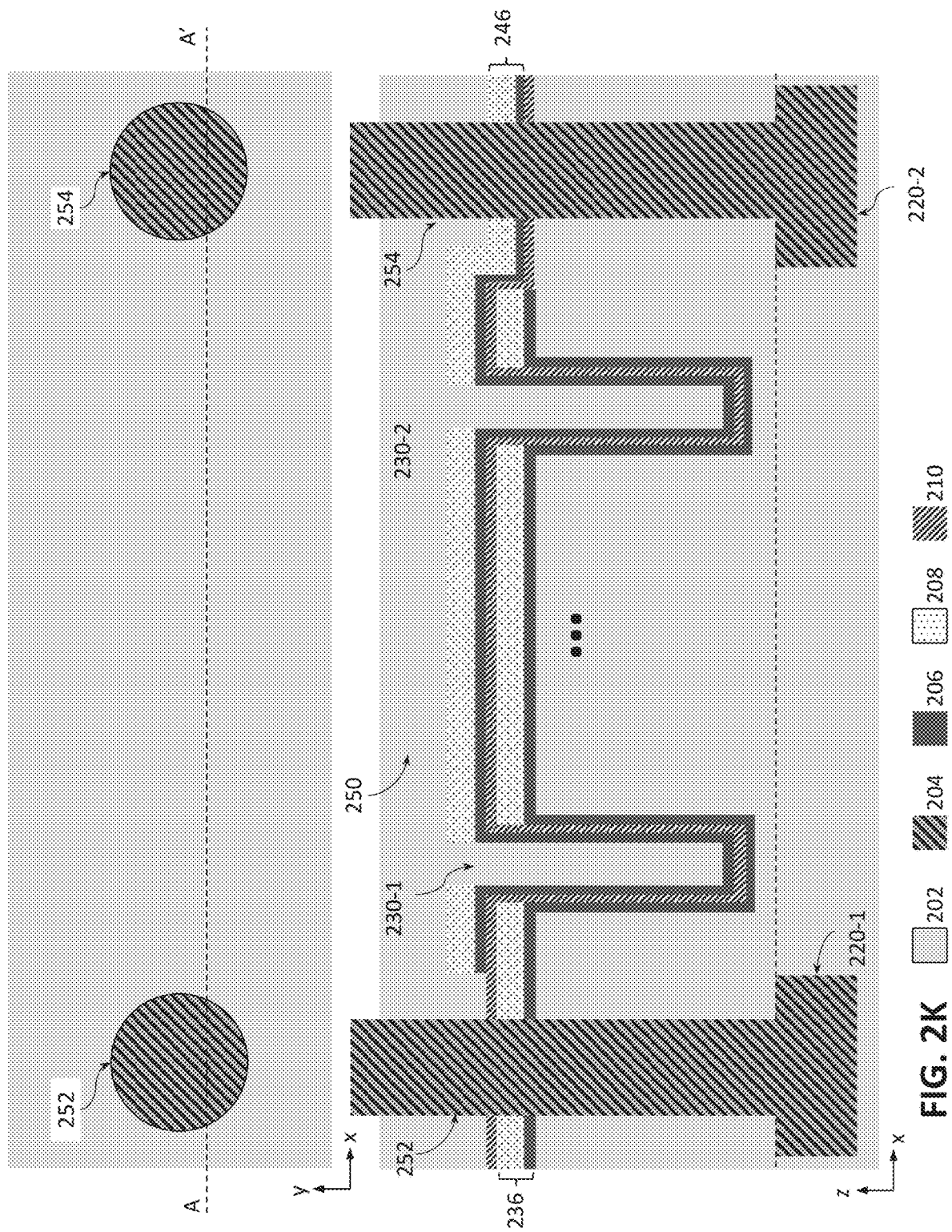

The method 100 may then proceed with a process 118 that includes patterning a second capacitor electrode contact. A result of this process is illustrated in FIG. 2I. As noted with respect to process 110, each of the capacitor electrodes 236 and 246 are coupled to a respective contact, e.g., a first via coupling the first capacitor electrode 236 to the first interconnect region 220-1, and a second via coupling the second electrode to the second interconnect region 220-2. The contacts are shown in FIG. 2K. To prevent the second capacitor electrode 246 from being connected to the first interconnect region 220-1, a portion 248-1 of the second capacitor electrode is removed, leaving the portion of the second capacitor electrode 246 within and surrounding the openings 230, as well as a portion 248-2 over the second interconnect region 220-2. The removed portion 248-1 is illustrated with a dashed box in the cross-sectional side view of FIG. 2I. For example, the second capacitor electrode 246 may be patterned and the portion 248-1 etched away, leaving a portion of the insulator layer 240 exposed, as illustrated in the top-down view. The insulator layer 240 act as an etch-stop material that prevents the etchant from layers below the removed portion 248-1 of the second capacitor electrode 246. Alternatively, an etch-stop material may be applied to the portion of the insulator layer 240 below the removed portion of the second capacitor electrode 246 between processes 112 and 114.

The method 100 may then proceed with a process 120 that includes depositing a top insulator material. A result of this process is illustrated in FIG. 2J, showing a top insulator layer 250 over the fourth conductive layer 244 and the exposed portion of the insulator layer 240. In this example, the top insulator layer 250 also fills the remaining portions of the openings 230 between the sidewall portions of the third conductive layer 242. In this example, the top insulator layer 250 is the first insulator material 202. In other embodiments, the top insulator layer 250 may be a different material or combination of materials, e.g., any of the insulator materials described with respect to the first insulator material 202.

The method 100 may then proceed with a process 122 that includes forming electrode contacts. A result of this process is illustrated in FIG. 2K, showing two electrode contacts 252 and 254 that electrically couple the capacitor electrodes to the interconnect structure 220. In particular, a first electrode contact 252 couples the first capacitor electrode 236 to the first interconnect region 220-1, and a second electrode contact 254 couples the second capacitor electrode 246 to the second interconnect region 220-2. The first electrode contact 252 is in contact with the planar portion of the first capacitor electrode 236, and the second electrode contact 254 is in contact with the planar portion of the second capacitor electrode 246. In this example, the contacts 252 and 254 apply a voltage difference to the capacitor electrodes 236 and 246 based on voltage settings transferred through the interconnect structure 220. The contacts 252 and 254 illustrated in FIG. 2K are formed of the first electrically conductive material 204. In other embodiments, the contacts 252 and 254 may include any suitable electrically conductive material, such as any of the electrically conductive materials described above with reference to the first electrically conductive material 204.

The first capacitor electrode 236, insulator layer 240, and second capacitor electrode 246 form a three-dimensional capacitor. In particular, the capacitor electrodes 236 and 246 and the insulator layer 240 each include via portions extending in the z-direction into the via openings 230, and planar portions extending parallel to the x-y plane. Extending the capacitor into the via portions increases the surface area between the first and second capacitor electrodes 236 and 346 compared to a traditional capacitor that only includes the planar portions. Increasing the surface area using the three-dimensional via structure can result in a significantly higher capacitance compared to a capacitor that only includes the planar portions, e.g., a capacitance five or ten times higher than a planar capacitor.

During operation, charge applied by the contacts 252 and 254 travels across the planar portions of the capacitor electrodes, and into the via portions of the capacitor electrodes. Increasing the thickness of the planar portions reduces resistance across the planar portions, enabling charge to better travel across a large plate. However, as the thickness of the planar portions increases, the deposition process used to form the second and fourth conductive layer may cover or clog the openings 230.

Example Three-Dimensional Capacitors with Three Double Metal Electrodes

Figure 3:
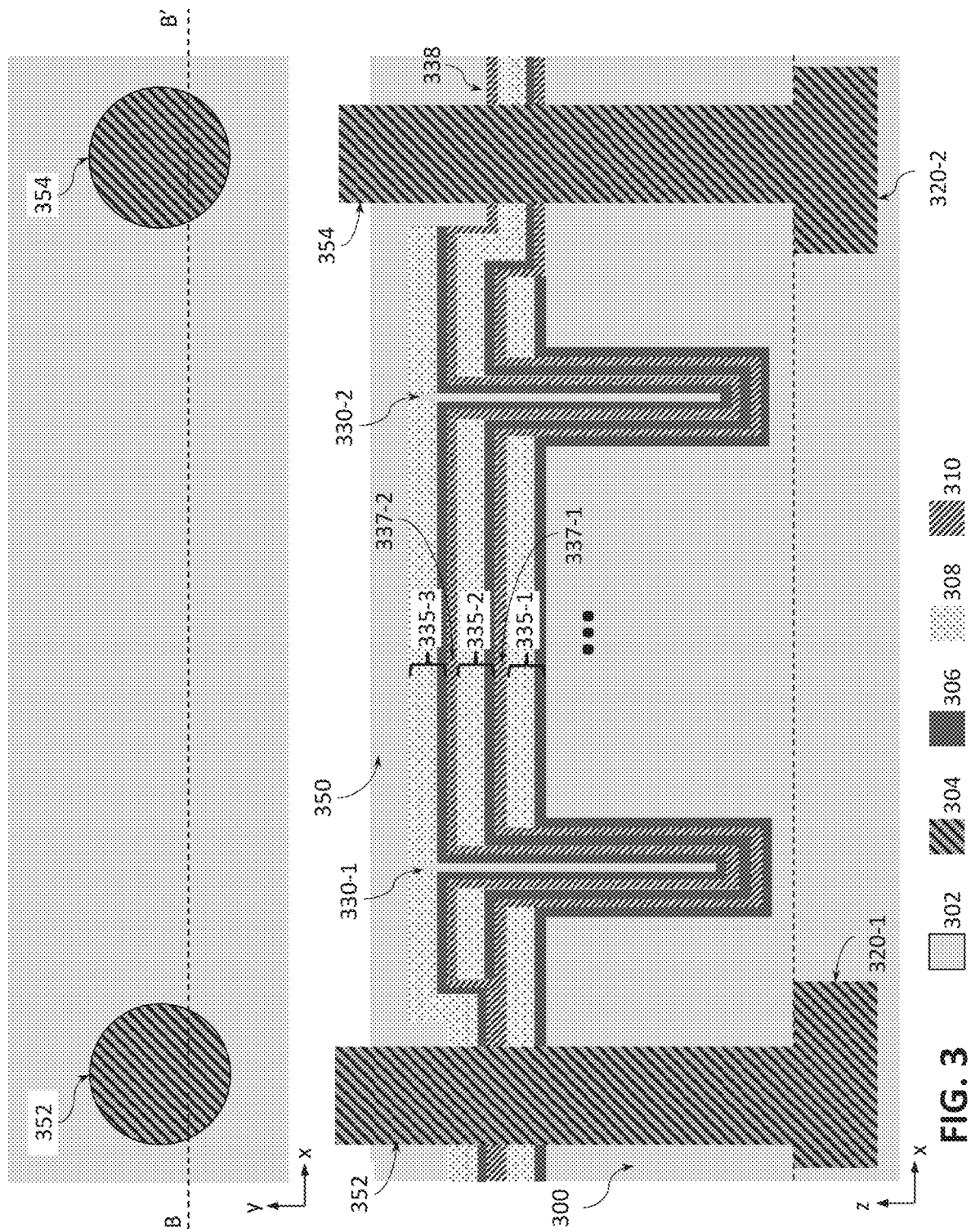
FIG. 3 illustrates an example three-dimensional capacitor with three double metal electrodes and two electrode contacts, in accordance with some embodiments.

FIG. 3 illustrates an example three-dimensional capacitor with three double metal electrodes and two electrode contacts, in accordance with some embodiments. FIG. 3 illustrates top-down and cross-sectional side views for an IC structure with a three-dimensional capacitor, in accordance with some embodiments. In particular, FIG. 3 shows, at the top of the page of the drawing, a top-down view (i.e., a view in a x-y plane) of the IC structure and, at the bottom of the page of the drawing, a cross-section side view of the IC structure with the cross-section taken along an x-z plane BB' of the reference coordinate system x-y-z shown in FIG. 3. The legend illustrates that FIG. 3 uses different patterns to show a first insulator material 302, a first electrically conductive material 304, a second electrically conductive material 306, a third electrically conductive material 308, and a second insulator material 310. These materials are similar to the materials 202-210, described above.

The capacitor includes three capacitor electrodes, 335-1, 335-2, and 335-3 (referred to jointly as capacitor electrodes 335), and two insulator layers, 337-1 and 337-2 (referred to jointly as insulator layers 337). A first insulator layer 337-1 is between a first and second capacitor electrode, 335-1 and 335-2, and a second insulator layer 337-2 is between the second capacitor electrode 335-2 and a third capacitor electrode 337-3. The capacitor electrodes 335 are double-layer electrodes, e.g., double metal electrodes, as described above with respect to capacitor electrodes 236 and 246. In particular, each capacitor electrode 335 includes a planar portion and via portions, where the via portions extend into openings 330 formed in the support structure 300, e.g., openings 330-1 and 330-2 shown in FIG. 3. Each insulator layer 337 also includes a planar portion and via portions, where the via portions extend into the openings 330. The capacitor electrodes 335 are similar to the capacitor electrodes 236 and 346 described with respect to FIGS. 1 and 2, and the insulator layers 337 are similar to the insulator layer 240 described with respect to FIGS. 1 and 2. In this example, rather than having two capacitor electrodes and one insulator layer, an additional insulator layer 337-2 and an additional capacitor electrode 335-3 are formed, e.g., after the process 118 illustrated in FIG. 2I, and before the top insulator layer 350 is formed over the capacitor. Via portions of the second insulator layer 337-2 are nested within via portions of the second capacitor electrode 335-2, and via portions of the third capacitor electrode 335-3 are nested within via portions of the second insulator layer 337-2.

In this example, after the second insulator layer 337-2 and third capacitor electrode 335-3 are formed, the third capacitor electrode 335-3 is patterned and etched in a manner similar to the processes 110 and 118 described with respect to FIGS. 1 and 2. Patterning and etching the third capacitor electrode 335-3 reveals a portion 338 of the second insulator layer 337-2. After patterning and etching the third capacitor electrode 335-3, the top insulator layer 350 is deposited. Finally, two electrode contacts 352 and 354 are formed.

The first electrode contact 352 connects the third capacitor electrode 335-3 and the first capacitor electrode 335-1 to a first interconnect region 320-1, and a second electrode contact 354 connects the second capacitor electrode 335-2 to the second interconnect region 320-2. The electrode contacts 352 and 354 are similar to the electrode contacts 252 and 254 described with respect to FIGS. 1-2, and the interconnect regions 320-1 and 320-2 are similar to the interconnect regions 220-1 and 220-2 described with respect to FIGS. 1-2. During operation, the first electrode contact 352 applies a first voltage to the first capacitor electrode 335-1 and the third capacitor electrode 335-3, and the second electrode contact 354 applies a second voltage to the second capacitor electrode 335-2.

In an alternate embodiment, each of the capacitor electrodes can be coupled to a different contact, so that a first voltage is applied to a first electrode contact, a second voltage is applied to a second electrode contact, and a third voltage is applied to a third electrode contact.

Figure 4:
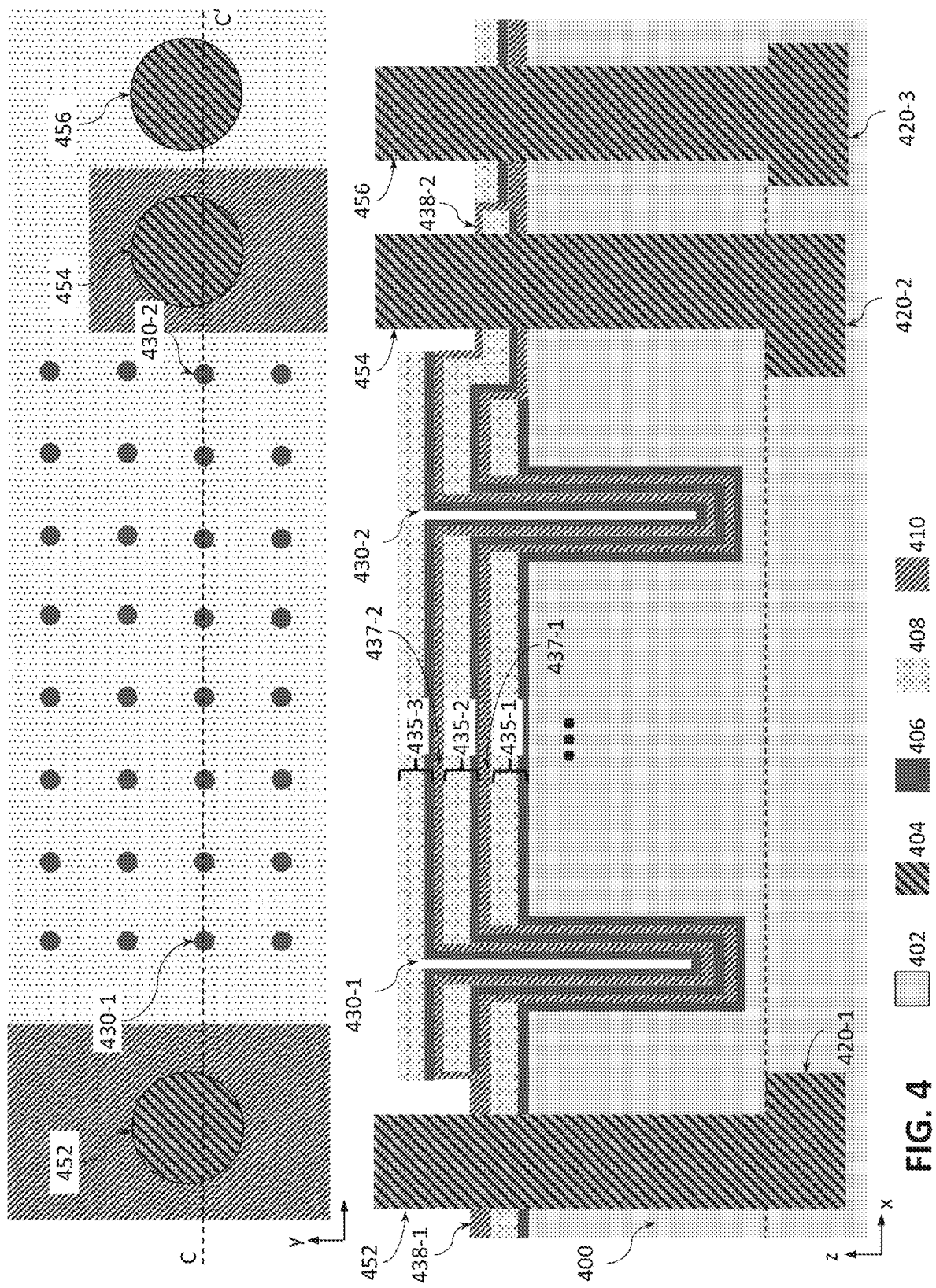
FIG. 4 illustrates an example three-dimensional capacitor with three double metal electrodes and three electrode contacts, in accordance with some embodiments.

FIG. 4 illustrates an example three-dimensional capacitor with three double metal electrodes and three electrode contacts, in accordance with some embodiments. FIG. 4 illustrates top-down and cross-sectional side views for an IC structure with a three-dimensional capacitor, in accordance with some embodiments. In particular, FIG. 4 shows, at the top of the page of the drawing, a top-down view (i.e., a view in a x-y plane) of the IC structure and, at the bottom of the page of the drawing, a cross-section side view of the IC structure with the cross-section taken along an x-z plane CC' of the reference coordinate system x-y-z shown in FIG. 4. Note that the scales of the top-down views and cross-section side views differ; the cross-section side view is shown at a larger, zoomed in scale to illustrate the capacitor structure within two example openings. The legend illustrates that FIG. 4 uses different patterns to show a first insulator material 402, a first electrically conductive material 404, a second electrically conductive material 406, a third electrically conductive material 408, and a second insulator material 410. These materials are similar to the materials 202-210, described above.

The capacitor includes three capacitor electrodes, 435-1, 435-2, and 435-3 (referred to jointly as capacitor electrodes 435), and two insulator layers, 437-1 and 437-2 (referred to jointly as insulator layers 437). The arrangement of the capacitor electrodes 435 and insulator layers 437 are similar to the capacitor electrodes 335 and insulator layers 337 described with respect to FIG. 3. For example, each capacitor electrode 435 includes a planar portion and via portions, where the via portions extend into openings 430 formed in the support structure 400, e.g., openings 430-1 and 430-2 shown in FIG. 4. Each insulator layer 437 also includes a planar portion and via portions, where the via portions extend into the openings 430.

A first electrode contact 452 connects the first capacitor electrode 435-1 to a first interconnect region 420-1, a second electrode contact 454 connects the second capacitor electrode 435-2 to a second interconnect region 420-2, and a third electrode contact 456 connects the third capacitor electrode 435-3 to a third interconnect region 420-3. The electrode contacts 452, 454, and 456 are similar to the electrode contacts 252 and 254 described with respect to FIGS. 1-2, and the interconnect regions 420-1, 420-2, and 420-3 are similar to the interconnect regions 220-1 and 220-2 described with respect to FIGS. 1-2. During operation, the first electrode contact 452 applies a first voltage to the first capacitor electrode 435-1, the second electrode contact 454 applies a second voltage to the second capacitor electrode 435-2, and the third electrode contact 456 applies a third voltage to the third capacitor electrode 435-3.

To couple the interconnect regions 420-1, 420-2, and 420-3 to the capacitor electrodes 437 as described above, after the first capacitor electrode 435-1 is formed, the first capacitor electrode 435-1 is patterned and etched in a manner similar to the process 110 described with respect to FIGS. 1 and 2. In this example, the first capacitor electrode 435-1 is etched in a region over two interconnect regions, 420-2 and 420-3. After the second capacitor electrode 435-2 is formed, the second capacitor electrode 435-2 is patterned and etched in a manner similar to the process 118 described with respect to FIGS. 1 and 2. In this example, the second capacitor electrode 435-2 is etched in a region over two interconnect regions, 420-1 and 420-3. Finally, after the second insulator layer 437-2 and third capacitor electrode 435-3 are formed, the third capacitor electrode 435-3 is patterned and etched in a manner similar to the processes 110 and 118 described with respect to FIGS. 1 and 2. Patterning and etching the third capacitor electrode 435-3 reveals portions 438-1 and 438-2 of the second insulator layer 437-2. These revealed portions are over two interconnect regions, 420-1 and 420-2. As shown in the top-down view in FIG. 4, the remaining portion of the third capacitor electrode 435-3 extends around the location of the second electrode contact 454, so that the third capacitor electrode 435-3 is connected to the third electrode contact 456 but not the second electrode contact 454. After patterning and etching the third capacitor electrode 435-3, and prior to forming the electrode contacts 452, 454, and 456, a top insulator layer may be deposited, similar to the top insulator layers 250 and 350 in FIGS. 2 and 3. The top insulator layer is omitted from FIG. 4 to show the arrangement of the etched third capacitor electrode 435-3.

Example Memory Cell Including a Three-Dimensional Capacitor

A memory cell, e.g., an eDRAM cell, may include a capacitor for storing a bit value, or a memory state (e.g., logical "1" or "0") of the cell, and an access transistor controlling access to the cell (e.g., access to write information to the cell or access to read information from the cell). Such a memory cell may be referred to as a "1T-1C memory cell," highlighting the fact that it uses one transistor (i.e., "1T" in the term "1T-1C memory cell") and one capacitor (i.e., "1C" in the term "1T-1C memory cell"). The capacitor of a 1T-1C memory cell may be coupled to one source/drain (S/D) terminal of the access transistor (e.g., to the source terminal of the access transistor), while the other S/D terminal of the access transistor may be coupled to a bitline (BL), and a gate terminal of the transistor may be coupled to a wordline (WL). Since such a memory cell can be fabricated with as little as a single access transistor, it can provide higher density and lower standby power versus static random-access memory (SRAM) in the same process technology.

FIG. 5 provides a schematic illustration of a cross-sectional view of an example memory cell 500 that includes any of the capacitors described herein, in accordance with some embodiments. FIG. 5 illustrates how a transistor 501 and a capacitor 522 may be used to form a 1T-1C memory cell. In particular, the memory cell 500 schematically illustrates that, in some embodiments, a capacitor 522 may be coupled to a back-side S/D contact 506-1 of the transistor 501.

In general, a field-effect transistor (FET), e.g., a metal oxide semiconductor (MOS) FET (MOSFET), is a three-terminal device that includes source, drain, and gate terminals and uses electric field to control current flowing through the device. A FET typically includes a channel material, a source region and a drain region provided in the channel material, and a gate stack that includes a gate electrode material, alternatively referred to as a "work function" material, provided over a portion of the channel material between the source and the drain regions, and, optionally, also includes a gate dielectric material between the gate electrode material and the channel material. This general structure of the transistor 501 is shown in FIG. 5, illustrating a channel material 502, S/D regions 504 (shown as a first S/D region 504-1, e.g., a source region, and a second S/D region 504-2, e.g., a drain region), contacts 506 to S/D regions (shown as a first S/D contact 506-1, providing electrical contact to the first S/D region 504-1, and a second S/D contact 506-2, providing electrical contact to the second S/D region 504-2), and a gate stack 508, which includes at least a gate electrode 510 and may also, optionally, include a gate dielectric 512.

In some embodiments, the channel material 502 may be composed of semiconductor material systems including, for example, N-type or P-type materials systems. In some embodiments, the channel material 502 may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the channel material 502 may include a combination of semiconductor materials where one semiconductor material may be used for the channel portion (e.g., a portion 514 shown in FIG. 5, which is supposed to refer to the upper-most portion of the channel material 502) and another material, sometimes referred to as a "blocking material," may be used between the channel portion 514 and the support structure over which the transistor 501 is provided. In some embodiments, the channel material 502 may include a monocrystalline semiconductor, such as silicon (Si) or germanium (Ge). In some embodiments, the channel material 502 may include a compound semiconductor with a first sub-lattice of at least one element from group III of the periodic table (e.g., Al, Ga, In), and a second sub-lattice of at least one element of group V of the periodic table (e.g., P, As, Sb).

For some example N-type transistor embodiments (i.e., for the embodiments where the transistor 501 is an N-type metal oxide semiconductor (NMOS)), the channel portion 514 of the channel material 502 may advantageously include a III-V material having a high electron mobility, such as, but not limited to InGaAs, InP, InSb, and InAs. For some such embodiments, the channel portion 514 of the channel material 502 may be a ternary III-V alloy, such as InGaAs, GaAsSb, InAsP, or InPSb. For some $In_xGa_{1-x}As$ fin embodiments, In content (x) may be between 0.6 and 0.9, and may advantageously be at least 0.7 (e.g., $In_{0.7}Ga_{0.3}As$). In some embodiments with highest mobility, the channel portion 514 of the channel material 502 may be an intrinsic III-V material, i.e., a III-V semiconductor material not intentionally doped with any electrically active impurity. In alternate embodiments, a nominal impurity dopant level may be present within the channel portion 514 of the channel material 502, for example to further fine-tune a threshold voltage Vt, or to provide HALO pocket implants, etc. Even for impurity-doped embodiments however, impurity dopant level within the channel portion 514 of the channel material 502 may be relatively low, for example below $10^{15}$ dopant atoms per cubic centimeter ($cm^{-3}$), and advantageously below $10^{13}$ $cm^{-3}$.

For some example P-type transistor embodiments (i.e., for the embodiments where the transistor 501 is a P-type metal oxide semiconductor (PMOS)), the channel portion 514 of the channel material 502 may advantageously be a group IV material having a high hole mobility, such as, but not limited to Ge or a Ge-rich SiGe alloy. For some example embodiments, the channel portion 514 of the channel material 502 may have a Ge content between 0.6 and 0.9, and advantageously may be at least 0.7. In some embodiments with highest mobility, the channel portion 514 may be intrinsic III-V (or IV for P-type devices) material and not intentionally doped with any electrically active impurity. In alternate embodiments, one or more a nominal impurity dopant level may be present within the channel portion 514, for example to further set a threshold voltage (Vt), or to provide HALO pocket implants, etc. Even for impurity-doped embodiments however, impurity dopant level within the channel portion is relatively low, for example below $10^{15}$ cm$^{-3}$, and advantageously below $10^{13}$ cm$^{-3}$.

In some embodiments, the transistor 501 may be a thin film transistor (TFT). A TFT is a special kind of a field-effect transistor made by depositing a thin film of an active semiconductor material, as well as a dielectric layer and metallic contacts, over a supporting layer that may be a non-conducting layer. At least a portion of the active semiconductor material forms a channel of the TFT. If the transistor 501 is a TFT, the channel material 502 may include a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, if the transistor 501 is a TFT, the channel material 502 may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphite, and black phosphorus, each of which may possibly be doped with one or more of gallium, indium, aluminum, fluorine, boron, phosphorus, arsenic, nitrogen, tantalum, tungsten, and magnesium, etc. In some embodiments, the channel material 602 may have a thickness between about 5 and 75 nanometers, including all values and ranges therein. In some embodiments, a thin film channel material 602 may be deposited at relatively low temperatures, which allows depositing the channel material 602 within the thermal budgets imposed on back end fabrication to avoid damaging other components, e.g., front end components such as the logic devices.

As shown in FIG. 5, a first and a second S/D regions 504-1, 504-2 (together referred to as "S/D regions 504") may be included on either side of the gate stack 508, thus realizing a transistor. As is known in the art, source and drain regions (also sometimes interchangeably referred to as "diffusion regions") are formed for the gate stack of a FET. In some embodiments, the S/D regions 504 of the transistor 501 may be regions of doped semiconductors, e.g. regions of the channel material 502 (e.g., of the channel portion 514) doped with a suitable dopant to a suitable dopant concentration, so as to supply charge carriers for the transistor channel. In some embodiments, the S/D regions 504 may be highly doped, e.g. with dopant concentrations of about $1 \cdot 10^{21}$ cm$^{-3}$, in order to advantageously form Ohmic contacts with the respective S/D contacts 506, although, in other embodiments, these regions may also have lower dopant concentrations and may form Schottky contacts in some implementations. Irrespective of the exact doping levels, the S/D regions 504 of the transistor 501 may be the regions having dopant concentration higher than in other regions, e.g. higher than a dopant concentration in a region of the channel material 502 between the first S/D region 504-1 and the second S/D region 504-2, and, therefore, may be referred to as "highly doped" (HD) regions. In some embodiments, the S/D regions 504 may generally be formed using either an implantation/diffusion process or an etching/deposition process. In the former process, dopants such as boron, aluminum, antimony, phosphorous, or arsenic may be ion-implanted into the one or more semiconductor materials of the upper portion of the channel material 502 to form the S/D regions 504. An annealing process that activates the dopants and causes them to diffuse further into the channel material 502 may follow the ion implantation process. In the latter process, the one or more semiconductor materials of the channel material 502 may first be etched to form recesses at the locations for the future S/D regions. An epitaxial deposition process may then be carried out to fill the recesses with material (which may include a combination of different materials) that is used to fabricate the S/D regions 504. In some implementations, the S/D regions 504 may be fabricated using a silicon alloy such as silicon germanium or silicon carbide. In some implementations, the epitaxially deposited silicon alloy may be doped in situ with dopants such as boron, arsenic, or phosphorous. In further embodiments, the S/D regions 504 may be formed using one or more alternate semiconductor materials such as germanium or a group III-V material or alloy. Although FIG. 5 illustrates the first and second S/D regions 504 with a single pattern, suggesting that the material composition of the first and second S/D regions 504 is the same, this may not be the case in some other embodiments of the transistor 501. Thus, in some embodiments, the material composition of the first S/D region 504-1 may be different from the material composition of the second S/D region 504-2.

As further shown in FIG. 5, S/D contacts 506-1 and 506-2 (together referred to as "S/D contacts 506"), formed of one or more electrically conductive materials, may be used for providing electrical connectivity to the S/D regions 504-1 and 504-2, respectively. In various embodiments, one or more layers of metal and/or metal alloys may be used to form the S/D contacts 506. For example, the electrically conductive materials of the S/D contacts 506 may include one or more metals or metal alloys, with materials such as copper, ruthenium, palladium, platinum, cobalt, nickel, hafnium, zirconium, titanium, tantalum, and aluminum, tantalum nitride, tungsten, doped silicon, doped germanium, or alloys and mixtures of any of these. In some embodiments, the S/D contacts 506 may include one or more electrically conductive alloys, oxides, or carbides of one or more metals. In some embodiments, the S/D contacts 506 may include a doped semiconductor, such as silicon or another semiconductor doped with an N-type dopant or a P-type dopant. Metals may provide higher conductivity, while doped semiconductors may be easier to pattern during fabrication. Although FIG. 5 illustrates the first and second S/D contacts 506 with a single pattern, suggesting that the material composition of the first and second S/D contacts 506 is the same, this may not be the case in some other embodiments of the transistor 501. Thus, in some embodiments, the material composition of the first S/D contact 506-1 may be different from the material composition of the second S/D contact 506-2.

Turning to the gate stack 508, the gate electrode 510 may include at least one P-type work function metal or N-type work function metal, depending on whether the transistor 501 is a PMOS transistor or an NMOS transistor. For a PMOS transistor, metals that may be used for the gate electrode 510 may include, but are not limited to, ruthenium, palladium, platinum, cobalt, nickel, and conductive metal oxides (e.g., ruthenium oxide). For an NMOS transistor, metals that may be used for the gate electrode 510 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode 510 may include a stack of two or more metal layers, where one or more metal layers are WF metal layers and at least one metal layer is a fill metal layer. Further metal layers may be included for other purposes, such as to act as a diffusion barrier layer, described below.

If used, the gate dielectric 512 may at least laterally surround the channel portion 514, and the gate electrode 510 may laterally surround the gate dielectric 512 such that the gate dielectric 512 is disposed between the gate electrode 510 and the channel material 502. In various embodiments, the gate dielectric 512 may include one or more high-k dielectric materials and may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric 512 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 512 during manufacture of the transistor 501 to improve the quality of the gate dielectric 512. In some embodiments, the gate dielectric 512 may have a thickness between about 0.5 nanometers and 3 nanometers, including all values and ranges therein, e.g., between about 1 and 3 nanometers, or between about 1 and 2 nanometers.

In some embodiments, the gate dielectric 512 may be a multilayer gate dielectric, e.g., it may include any of the high-k dielectric materials in one layer and a layer of IGZO. In some embodiments, the gate stack 508 may be arranged so that the IGZO is disposed between the high-k dielectric and the channel material 502. In such embodiments, the IGZO may be in contact with the channel material 502, and may provide the interface between the channel material 502 and the remainder of the multilayer gate dielectric 512. The IGZO may have a gallium to indium ratio of 1:1, a gallium to indium ratio greater than 1 (e.g., 2:1, 3:1, 4:1, 5:1, 6:1, 7:1, 8:1, 9:1, or 10:1), and/or a gallium to indium ratio less than 1 (e.g., 1:2, 1:3, 1:4, 1:5, 1:6, 1:7, 1:8, 1:9, or 1:10).

In some embodiments, the gate stack 508 may be surrounded by a dielectric spacer, not specifically shown in FIG. 5. The dielectric spacer may be configured to provide separation between the gate stacks 508 of different transistors 501 which may be provided adjacent to one another (e.g., different transistors 501 provided along a single fin if the transistors 501 are FinFETs), as well as between the gate stack 508 and one of the S/D contacts 506 that is disposed on the same side as the gate stack 508. Such a dielectric spacer may include one or more low-k dielectric materials. Examples of the low-k dielectric materials that may be used as the dielectric spacer include, but are not limited to, silicon dioxide, carbon-doped oxide, silicon nitride, fused silica glass (FSG), and organosilicates such as silsesquioxane, siloxane, and organosilicate glass. Other examples of low-k dielectric materials that may be used as the dielectric spacer include organic polymers such as polyimide, polynorbornenes, benzocyclobutene, perfluorocyclobutane, or polytetrafluoroethylene (PTFE). Still other examples of low-k dielectric materials that may be used as the dielectric spacer include silicon-based polymeric dielectrics such as hydrogen silsesquioxane (HSQ) and methylsilsesquioxane (MSQ). Other examples of low-k materials that may be used in a dielectric spacer include various porous dielectric materials, such as for example porous silicon dioxide or porous carbon-doped silicon dioxide, where large voids or pores are created in a dielectric in order to reduce the overall dielectric constant of the layer, since voids can have a dielectric constant of nearly 1.

In stark contrast to conventional implementations where both S/D contacts are typically provided on a single side of a transistor, typically on the front side, e.g., where the gate stack 508 is provided, the two S/D contacts 506 are provided on different sides. Namely, as shown in FIG. 5, the second S/D contact 506-2 is provided on the same side as the gate stack 508, which may be considered to be the front side of the transistor 501, while the first S/D contact 506-1 is provided on the opposite side, which may be considered to be the back side of the transistor 501. Thus, the first S/D contact 506-1 is the back-side contact and the second S/D contact 506-2 is the front-side contact of the transistor 501. If considering the layers above a support structure (not shown in FIG. 5) over which the entire transistor 501 is built, then the first S/D contact 506-1 may be considered to be in a first layer above the support structure, the second S/D contact 506-2 may be considered to be in a second layer above the support structure, and a portion of the channel material 502 between the first S/D region 504-1 and the second S/D region 504-2 (e.g., the channel portion 514) is in a third layer over the support structure. As can be seen from FIG. 5, the third layer is between the first layer and the second layer. At least a portion of the gate stack 508, or a contact to the gate stack 508 (such a gate contact not specifically shown in FIG. 5), may be provided in the same layer as one of the S/D contacts 506.

Transistors having one front-side and one back-side S/D contacts as described herein, such as the transistor 501, may be implemented using any suitable transistor architecture, e.g. planar or non-planar architectures. One example structure is shown in FIGS. 7A-7B, illustrating perspective and cross-sectional views, respectively, of an example IC device 700 having a transistor with a back-side contact implemented as a FinFET, according to some embodiments of the present disclosure. Thus, the IC device 700 illustrates one example implementation of the transistor 501. Therefore, some of the reference numerals shown in FIGS. 7A-7B are the same as those used in FIG. 5, indicating the same or similar elements as those described with reference to FIG. 5, so that their descriptions are not repeated for FIGS. 7A-7B.

The capacitor 522 may be a three-dimensional double metal capacitor electrode for storing a bit value, or a memory state (e.g., logical "1" or "0") of the memory cell 500, and the transistor 501 may then function as an access transistor controlling access to the memory cell 500 (e.g., access to write information to the cell or access to read information from the cell). By coupling the capacitor 522 to the S/D region 504-1, the capacitor 522 is configured to store the memory state of the memory cell 500. In some embodiments, the capacitor 522 may be coupled to the S/D region 504-1 via a storage node (not specifically shown in FIG. 5) coupled to the S/D region 504-1. In some embodiments, the S/D contact 506-1 may be considered to be the storage node.

Although not specifically shown in FIG. 5, the memory cell 500 may further include a bitline to transfer the memory state and coupled to the one of the S/D regions 504 to which the capacitor 522 is not coupled (e.g., to the S/D region 504-2, for the illustration of FIG. 5). Such a bitline can be connected to a sense amplifier and a bitline driver which may, e.g., be provided in a memory peripheral circuit associated with a memory array in which the memory cell 500 may be included. Furthermore, although also not specifically shown in FIG. 5, the memory cell 500 may further include a wordline, coupled to the gate terminal of the transistor 501, e.g., coupled to the gate stack 508, to supply a gate signal. The transistor 501 may be configured to control transfer of a memory state of the memory cell 500 between the bitline and the storage node or the capacitor 522 in response to the gate signal.

FIG. 6 illustrates an example three-dimensional capacitor with a double metal electrode and a back-side contact for use in a memory cell, in accordance with some embodiments. The legend illustrates that FIG. 6 uses different patterns to show a first insulator material 602, a first electrically conductive material 604, a second electrically conductive material 606, a third electrically conductive material 608, and a second insulator material 610. These materials are similar to the materials 202-210, described above. Furthermore, the first electrically conductive material 604 forming the contacts 506-1 and 624 may be the same as the material 506 in FIG. 5, which also includes the contact 506-1.

The capacitor 522 includes a first capacitor electrode 612, an insulator layer 614, and a second capacitor electrode 616. The capacitor electrodes 612 and 616 are double-layer electrodes, e.g., double metal electrodes, as described above with respect to capacitor electrodes 236 and 246. In particular, each capacitor electrode 612 and 616 includes a planar portion and a via portion, where the via portion extends into an opening 630 formed in the support structure. The insulator layer 614 also includes a planar portion and a via portion, where the via portion extends into the opening 630. The capacitor electrodes 612 and 616 are similar to the capacitor electrodes 236 and 346 described with respect to FIGS. 1 and 2, and the insulator layer 614 is similar to the insulator layer 240 described with respect to FIGS. 1 and 2. In some embodiments, the capacitor 522 further includes an additional insulator layer and third capacitor layer, e.g., as described with respect to FIGS. 3 and 4.

In this example, the via portions of the capacitor electrodes 612 and 616 and the via portion of the insulator layer 614 extend into a single via opening 630, which is similar to the via openings 230 described with respect to FIG. 2. In this example, different openings formed in the support structure, e.g., openings 230a and 230 in FIG. 2, may form separate capacitors used for individual memory cells, rather than coupled together to form a larger capacitor, as shown in FIG. 2. For example, planar portions of different capacitor electrodes formed on the support structure 200 can be electrically isolated from each other, and each capacitor electrode can have an individual electrode contact. In the example shown in FIG. 6, the first capacitor electrode 612 is coupled to a first electrode contact 624, and the second capacitor electrode 616 is coupled to the back-side S/D contact 506-1 of the transistor 501. In this example, the first electrode contact 624 is a back-side contact, but alternatively, the first electrode contact 624 may be a front-side contact.

Example FinFET Transistor Architectures for Memory Cell

FIG. 7A is a perspective view, while FIG. 7B is a cross-sectional side view of an IC device/FinFET 700, according to some embodiments of the disclosure. FIGS. 7A-7B illustrate the channel material 502, the S/D regions 504, and the gate stack 508 showing the gate electrode 510 and the gate dielectric 512 as described with respect to FIG. 5. As shown in FIGS. 7A-7B, when the transistor 501 is implemented as a FinFET, the FinFET 700 may further include a base 702, a fin 704, and an STI material 706 enclosing the subfin portion of the fin 704. The S/D contacts 506 are not specifically shown in FIGS. 7A-7B in order to not clutter the drawings. The cross-sectional side view of FIG. 7B is the view in the y-z plane of the example coordinate system x-y-z shown in FIG. 7A, with the cross-section of FIG. 7B taken across the fin 704 (e.g., along the plane shown in FIG. 7A as a plane CC'). On the other hand, the cross-sectional side view of the transistor 501 in FIG. 5 is the view in the x-z plane of the example coordinate system shown in FIG. 7A with the cross-section taken along the fin 704 for one example portion of the gate stack 508 (e.g., along the plane shown in FIG. 7A and in FIG. 7B as a plane BB').

As shown in FIGS. 7A-7B, the fin 704 may extend away from the base 702 and may be substantially perpendicular to the base 702. The fin 704 may include one or more semiconductor materials, e.g. a stack of semiconductor materials, so that the upper-most portion of the fin (namely, the portion of the fin 704 enclosed by the gate stack 508) may serve as the channel region of the FinFET 700. Therefore, the upper-most portion of the fin 704 may be formed of the channel material 502 as described above and may include the channel portion 514.

The subfin of the fin 704 may be a binary, ternary, or quaternary III-V compound semiconductor that is an alloy of two, three, or even four elements from groups III and V of the periodic table, including boron, aluminum, indium, gallium, nitrogen, arsenic, phosphorus, antimony, and bismuth. For some example N-type transistor embodiments, the subfin portion of the fin 704 may be a III-V material having a band offset (e.g., conduction band offset for N-type devices) from the channel portion. Example materials, include, but are not limited to, GaAs, GaSb, GaAsSb, GaP, InAlAs, GaAsSb, AlAs, AlP, AlSb, and AlGaAs. In some N-type transistor embodiments of the FinFET 700 where the channel portion of the fin 704 (e.g., the channel portion 514) is InGaAs, the subfin may be GaAs, and at least a portion of the subfin may also be doped with impurities (e.g., P-type) to a greater impurity level than the channel portion. In an alternate heterojunction embodiment, the subfin and the channel portion of the fin 704 are each, or include, group IV semiconductors (e.g., Si, Ge, SiGe). The subfin of the fin 704 may be a first elemental semiconductor (e.g., Si or Ge) or a first SiGe alloy (e.g., having a wide bandgap). For some example P-type transistor embodiments, the subfin of the fin 704 may be a group IV material having a band offset (e.g., valance band offset for P-type devices) from the channel portion. Example materials, include, but are not limited to, Si or Si-rich SiGe. In some P-type transistor embodiments, the subfin of the fin 704 is Si and at least a portion of the subfin may also be doped with impurities (e.g., N-type) to a higher impurity level than the channel portion.

As further shown in FIGS. 7A-7B, the STI material 706 may enclose portions of the sides of the fin 704. A portion of the fin 704 enclosed by the STI 706 forms a subfin. In various embodiments, the STI material 706 may be a low-k or high-k dielectric including, but not limited to, elements such as hafnium, silicon, oxygen, nitrogen, titanium, tantalum, lanthanum, aluminum, zirconium, barium, strontium, yttrium, lead, scandium, niobium, and zinc. Further examples of dielectric materials that may be used in the STI material 706 may include, but are not limited to silicon nitride, silicon oxide, silicon dioxide, silicon carbide, silicon nitride doped with carbon, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate.

The gate stack 508 may wrap around the upper portion of the fin 704 (the portion above the STI 706), as shown in FIGS. 7A-7B, with a channel portion of the fin 704 (e.g., the channel portion 514, described above) corresponding to the portion of the fin 704 wrapped by the gate stack 508 as shown in FIGS. 7A-7B. In particular, the gate dielectric 512 (if used) may wrap around the upper-most portion of the fin 704, and the gate electrode 510 may wrap around the gate dielectric 512. The interface between the channel portion and the subfin portion of the fin 704 is located proximate to where the gate electrode 510 ends.

In some embodiments, the FinFET 700 may have a gate length, GL, (i.e. a distance between the first S/D region 504-1 and the second S/D region 504-2), a dimension measured along the fin 704 in the direction of the x-axis of the example reference coordinate system x-y-z shown in FIG. 5 and FIGS. 7A-7B, which may, in some embodiments, be between about 5 and 40 nanometers, including all values and ranges therein (e.g. between about 22 and 35 nanometers, or between about 20 and 30 nanometers). The fin 704 may have a thickness, a dimension measured in the direction of the y-axis of the reference coordinate system x-y-z shown in FIGS. 7A-7B, that may, in some embodiments, be between about 5 and 30 nanometers, including all values and ranges therein (e.g. between about 7 and 20 nanometers, or between about 10 and 15 nanometers). The fin 704 may have a height, a dimension measured in the direction of the z-axis of the reference coordinate system x-y-z shown in FIG. 5, which may, in some embodiments, be between about 30 and 350 nanometers, including all values and ranges therein (e.g. between about 30 and 200 nanometers, between about 75 and 250 nanometers, or between about 150 and 300 nanometers).

Although the fin 704 illustrated in FIGS. 7A-7B is shown as having a rectangular cross-section in a y-z plane of the reference coordinate system shown, the fin 704 may instead have a cross-section that is rounded or sloped at the "top" of the fin 704, and the gate stack 508 may conform to this rounded or sloped fin 704. In use, the FinFET 700 may form conducting channels on three "sides" of the channel portion of the fin 704, potentially improving performance relative to single-gate transistors (which may form conducting channels on one "side" of a channel material or substrate) and double-gate transistors (which may form conducting channels on two "sides" of a channel material or substrate).

While not specifically shown in FIG. 7A, S/D contacts 506 may be electrically connected to the S/D regions 504, but extending in different vertical directions with respect to the fin 704. For example, the first S/D contact 506-1 may be electrically connected to the first S/D region 504-1 and extend from the first S/D region 504-1 towards the base 702, thus forming a back-side S/D contact for the FinFET 700, similar to the illustration of FIG. 5. In such implementation, the second S/D contact 506-2 may be electrically connected to the second S/D region 504-2 and extend from the second S/D region 504-2 away from the base 702, thus forming a front-side S/D contact for the FinFET 700, also similar to the illustration of FIG. 5.

While FIGS. 7A-7B illustrate a single FinFET 700, in some embodiments, a plurality of FinFETs may be arranged next to one another (with some spacing in between) along the fin 704. Furthermore, in various further embodiments, the transistor 501 with one front-side and one back-side S/D contacts may be implemented in many other transistor architectures besides the FinFET 700, such as planar FETs, nanowire FETs, or nanoribbon FETs.

Example Layering

Figure 8:
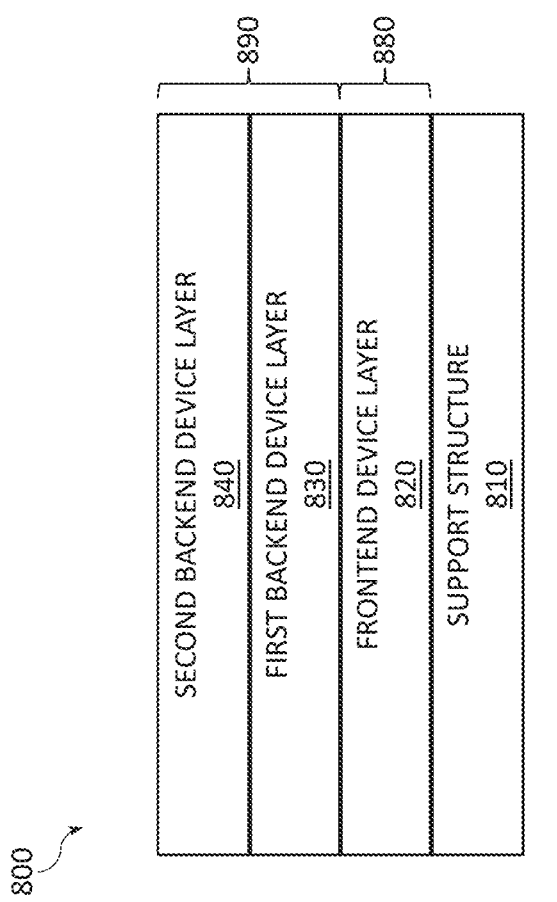
FIG. 8 provides a schematic illustration of an IC device with multiple layers of memory and logic that may include three-dimensional capacitors with double metal electrodes, according to some embodiments.

FIG. 8 provides a schematic illustration of a cross-sectional view of an example IC device 800 with multiple layers of memory and logic that may include three-dimensional capacitors with double metal electrodes, according to some embodiments of the present disclosure. As shown in FIG. 8, in general, the IC device 800 may include a support structure 810, a compute logic layer 820, a first memory layer 830, and a second memory layer 840.

The support structure 810 may, e.g., be a substrate, a die, a wafer or a chip, and may include any of the materials, or combinations of materials, described above.

The first and second memory layers 830, 840 may, together, be seen as forming a memory array 890. As such, the memory array 890 may include access transistors (e.g., the transistor 501), capacitors, as well as wordlines (e.g., row selectors) and bitlines (e.g., column selectors), making up memory cells. On the other hand, the compute logic layer 820 may include various logic layers, circuits, and devices (e.g., logic transistors) to drive and control a logic IC. For example, the logic devices of the compute logic layer 820 may form a memory peripheral circuit 880 to control (e.g., access (read/write), store, refresh) the memory cells of the memory array 890.

In some embodiments, the compute logic layer 820 may be provided in a FEOL with respect to the support structure 810. In some embodiments, the compute logic layer 820 may be provided in a FEOL and in one or more lowest BEOL layers (i.e., in one or more BEOL layers which are closest to the support structure 810), while the first memory layer 830 and the second memory layer 840 may be seen as provided in respective BEOL layers. Various BEOL layers may be, or include, metal layers. Various metal layers of the BEOL may be used to interconnect the various inputs and outputs of the logic devices in the compute logic layer 820 and/or of the memory cells in the memory layers 830, 840. Generally speaking, each of the metal layers of the BEOL may include a via portion and a trench/interconnect portion. The trench portion of a metal layer is configured for transferring signals and power along electrically conductive (e.g., metal) lines (also sometimes referred to as "trenches") extending in the x-y plane (e.g., in the x or y directions), while the via portion of a metal layer is configured for transferring signals and power through electrically conductive vias extending in the z-direction, e.g., to any of the adjacent metal layers above or below. Accordingly, vias connect metal structures (e.g., metal lines or vias) from one metal layer to metal structures of an adjacent metal layer. While referred to as "metal" layers, various layers of the BEOL may include only certain patterns of conductive metals, e.g., copper (Cu), aluminum (Al), tungsten (W), or cobalt (Co), or metal alloys, or more generally, patterns of an electrically conductive material, formed in an insulating medium such as an interlayer dielectric (ILD). The insulating medium may include any suitable ILD materials such as silicon oxide, carbon-doped silicon oxide, silicon carbide, silicon nitride, aluminum oxide, and/or silicon oxynitride.

In other embodiments of the IC device 800, the compute logic layer 820 may be provided above the memory layers 830, 840, in between memory layers 830, 840, or combined with the memory layers 830, 840.

Three-dimensional capacitors with double metal electrodes as described herein, as a decoupling capacitor and/or included as a part of a memory cell (e.g., the memory cell 500), may be included in various regions/locations in the IC device 800. For example, an array of capacitors 522 may be used to form memory cells in the first or second memory layers 830, 840.

The illustration of FIG. 8 is intended to provide a general orientation and arrangement of various layers with respect to one another, and, unless specified otherwise in the present disclosure, includes embodiments of the IC device 800 where portions of elements described with respect to one of the layers shown in FIG. 8 may extend into one or more, or be present in, other layers. For example, power and signal interconnects for the various components of the IC device 800 may be present in any of the layers shown in FIG. 8, although not specifically illustrated in FIG. 8. Furthermore, although two memory layers 830, 840 are shown in FIG. 8, in various embodiments, the IC device 800 may include any other number of one or more of such memory layers.

Example Devices

The IC structures with three-dimensional capacitors with double metal electrodes disclosed herein may be included in any suitable electronic device. FIGS. 9-12 illustrate various examples of apparatuses that may include one or more of the IC structures disclosed herein.

Figure 9B:
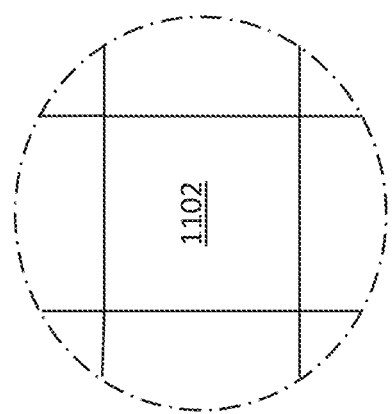
FIGS. 9A and 9B are top views of a wafer and dies that include one or more IC structures with three-dimensional capacitors in accordance with any of the embodiments disclosed herein.
Figure 9A:
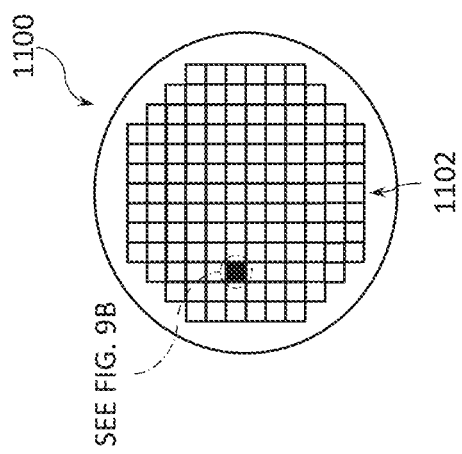

FIGS. 9A and 9B are top views of a wafer and dies that include one or more IC structures with one or more three-dimensional capacitors with double metal electrodes in accordance with any of the embodiments disclosed herein. The wafer 1100 may be composed of semiconductor material and may include one or more dies 1102 having IC structures formed on a surface of the wafer 1100. Each of the dies 1102 may be a repeating unit of a semiconductor product that includes any suitable IC structure (e.g., the IC structures as shown in any of FIGS. 2-7, or any further embodiments of the IC structures described herein). After the fabrication of the semiconductor product is complete (e.g., after manufacture of one or more IC structures with one or more three-dimensional capacitors with double metal electrodes as described herein, included in a particular electronic component, e.g., in a transistor or in a memory device), the wafer 1100 may undergo a singulation process in which each of the dies 1102 is separated from one another to provide discrete "chips" of the semiconductor product. In particular, devices that include one or more IC structures with one or more three-dimensional capacitors with double metal electrodes as disclosed herein may take the form of the wafer 1100 (e.g., not singulated) or the form of the die 1102 (e.g., singulated). The die 1102 may include one or more transistors (e.g., one or more of the transistors 1240 of FIG. 10, discussed below) and/or supporting circuitry to route electrical signals to the transistors, as well as any other IC components (e.g., one or more IC structures with one or more three-dimensional capacitors with double metal electrodes). In some embodiments, the wafer 1100 or the die 1102 may include a memory device (e.g., an SRAM device), a logic device (e.g., an AND, OR, NAND, or NOR gate), or any other suitable circuit element. Multiple ones of these devices may be combined on a single die 1102. For example, a memory array formed by multiple memory devices may be formed on a same die 1102 as a processing device (e.g., the processing device 1402 of FIG. 12) or other logic that is configured to store information in the memory devices or execute instructions stored in the memory array.

Figure 10:
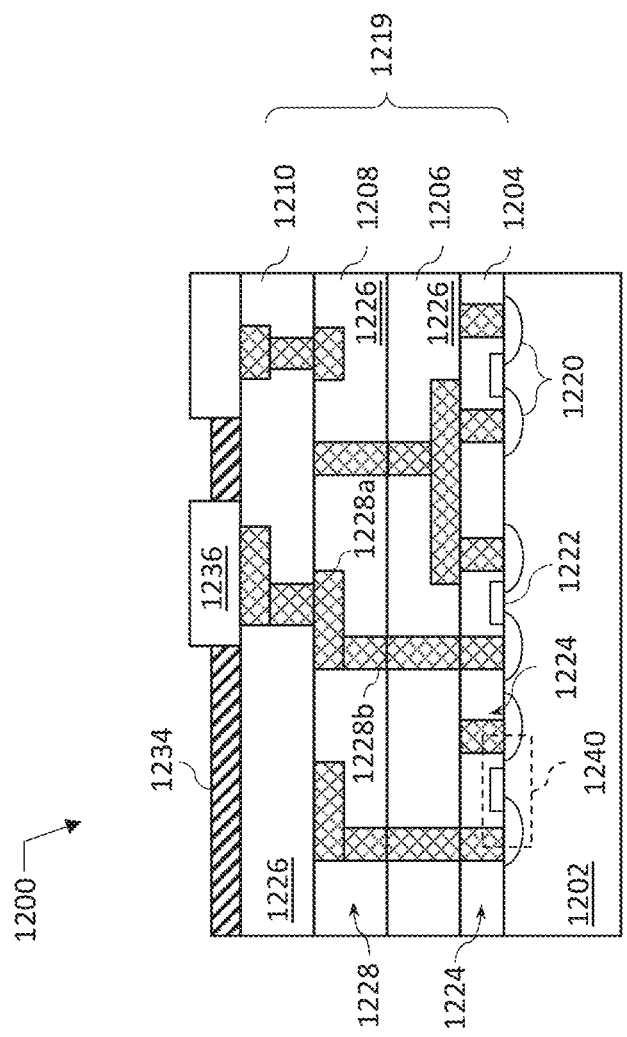
FIG. 10 is a cross-sectional side view of an IC device that may include one or more IC structures with three-dimensional capacitors in accordance with any of the embodiments disclosed herein.

FIG. 10 is a cross-sectional side view of an IC device 1200 that may include one or more IC structures with one or more three-dimensional capacitors with double metal electrodes in accordance with any of the embodiments disclosed herein. The IC device 1200 may be formed on a substrate 1202 (e.g., the wafer 1100 of FIG. 9A) and may be included in a die (e.g., the die 1102 of FIG. 9B). The substrate 1202 may be any substrate as described herein. The substrate 1202 may be part of a singulated die (e.g., the dies 1102 of FIG. 9B) or a wafer (e.g., the wafer 1100 of FIG. 9A).

The IC device 1200 may include one or more device layers 1204 disposed on the substrate 1202. The device layer 1204 may include features of one or more transistors 1240 (e.g., metal oxide semiconductor field-effect transistors (MOSFETs)) formed on the substrate 1202. The device layer 1204 may include, for example, one or more source and/or drain (S/D) regions 1220, a gate 1222 to control current flow in the transistors 1240 between the S/D regions 1220, and one or more S/D contacts 1224 to route electrical signals to/from the S/D regions 1220. The transistors 1240 may include additional features not depicted for the sake of clarity, such as device isolation regions, gate contacts, and the like. The transistors 1240 are not limited to the type and configuration depicted in FIG. 10 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1240 may include a gate 1222 formed of at least two layers, a gate electrode layer and a gate dielectric layer.

The gate electrode layer may be formed on the gate interconnect support layer and may consist of at least one P-type workfunction metal or N-type workfunction metal, depending on whether the transistor is to be a PMOS or an NMOS transistor, respectively. In some implementations, the gate electrode layer may consist of a stack of two or more metal layers, where one or more metal layers are workfunction metal layers and at least one metal layer is a fill metal layer. Further metal layers may be included for other purposes, such as a barrier layer or/and an adhesion layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 electron Volts (eV) and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, aluminum carbide, tungsten, tungsten carbide. An N-type metal layer will enable the formation of an NMOS gate electrode with a workfunction that is between about 3.9 eV and about 4.2 eV.

In some embodiments, when viewed as a cross-section of the transistor 1240 along the source-channel-drain direction, the gate electrode may be formed as a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may be implemented as a combination of U-shaped structures and planar, non-U-shaped structures. For example, the gate electrode may be implemented as one or more U-shaped metal layers formed atop one or more planar, non-U-shaped layers. In some embodiments, the gate electrode may consist of a V-shaped structure (e.g., when a fin of a FinFET transistor does not have a "flat" upper surface, but instead has a rounded peak).

Generally, the gate dielectric layer of a transistor 1240 may include one layer or a stack of layers, and the one or more layers may include silicon oxide, silicon dioxide, and/or a high-k dielectric material. The high-k dielectric material included in the gate dielectric layer of the transistor 1240 may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

Although not specifically shown in FIG. 10, the IC device 1200 may include one or more three-dimensional capacitors with double metal electrodes at any suitable location in the IC device 1200.

The S/D regions 1220 may be formed within the substrate 1202 adjacent to the gate 1222 of each transistor 1240, using any suitable processes known in the art. For example, the S/D regions 1220 may be formed using either an implantation/diffusion process or a deposition process. In the former process, dopants such as boron, aluminum, antimony, phosphorous, or arsenic may be ion-implanted into the substrate 1202 to form the S/D regions 1220. An annealing process that activates the dopants and causes them to diffuse farther into the substrate 1202 may follow the ion implantation process. In the latter process, an epitaxial deposition process may provide material that is used to fabricate the S/D regions 1220. In some implementations, the S/D regions 1220 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1220 may be formed using one or more alternate semiconductor materials such as germanium or a group III-V material or alloy. In further embodiments, one or more layers of metal and/or metal alloys may be used to form the S/D regions 1220. In some embodiments, an etch process may be performed before the epitaxial deposition to create recesses in the substrate 1202 in which the material for the S/D regions 1220 is deposited.

Electrical signals, such as power and/or input/output (I/O) signals, may be routed to and/or from the transistors 1240 of the device layer 1204 through one or more interconnect layers disposed on the device layer 1204 (illustrated in FIG. 10 as interconnect layers 1206-1210). For example, electrically conductive features of the device layer 1204 (e.g., the gate 1222 and the S/D contacts 1224) may be electrically coupled with the interconnect structures 1228 of the interconnect layers 1206-1210. The one or more interconnect layers 1206-1410 may form an ILD stack 1219 of the IC device 1200.

The interconnect structures 1228 may be arranged within the interconnect layers 1206-1210 to route electrical signals according to a wide variety of designs (in particular, the arrangement is not limited to the particular configuration of interconnect structures 1228 depicted in FIG. 10). Although a particular number of interconnect layers 1206-1210 is depicted in FIG. 10, embodiments of the present disclosure include IC devices having more or fewer interconnect layers than depicted.

In some embodiments, the interconnect structures 1228 may include trench contact structures 1228a (sometimes referred to as "lines") and/or via structures 1228b (sometimes referred to as "holes") filled with an electrically conductive material such as a metal. The trench contact structures 1228a may be arranged to route electrical signals in a direction of a plane that is substantially parallel with a surface of the substrate 1202 upon which the device layer 1204 is formed. For example, the trench contact structures 1228a may route electrical signals in a direction in and out of the page from the perspective of FIG. 10. The via structures 1228b may be arranged to route electrical signals in a direction of a plane that is substantially perpendicular to the surface of the substrate 1202 upon which the device layer 1204 is formed. In some embodiments, the via structures 1228b may electrically couple trench contact structures 1228a of different interconnect layers 1206-1210 together.

The interconnect layers 1206-1210 may include a dielectric material 1226 disposed between the interconnect structures 1228, as shown in FIG. 10. The dielectric material 1226 may take the form of any of the embodiments of the dielectric material provided between the interconnects of the IC structures disclosed herein.

In some embodiments, the dielectric material 1226 disposed between the interconnect structures 1228 in different ones of the interconnect layers 1206-1210 may have different compositions. In other embodiments, the composition of the dielectric material 1226 between different interconnect layers 1206-1210 may be the same.

A first interconnect layer 1206 (referred to as Metal 1 or "M1") may be formed directly on the device layer 1204. In some embodiments, the first interconnect layer 1206 may include trench contact structures 1228a and/or via structures 1228b, as shown. The trench contact structures 1228a of the first interconnect layer 1206 may be coupled with contacts (e.g., the S/D contacts 1224) of the device layer 1204.

A second interconnect layer 1208 (referred to as Metal 2 or "M2") may be formed directly on the first interconnect layer 1206. In some embodiments, the second interconnect layer 1208 may include via structures 1228b to couple the trench contact structures 1228a of the second interconnect layer 1208 with the trench contact structures 1228a of the first interconnect layer 1206. Although the trench contact structures 1228a and the via structures 1228b are structurally delineated with a line within each interconnect layer (e.g., within the second interconnect layer 1208) for the sake of clarity, the trench contact structures 1228a and the via structures 1228b may be structurally and/or materially contiguous (e.g., simultaneously filled during a dual-damascene process) in some embodiments.

A third interconnect layer 1210 (referred to as Metal 3 or "M3") (and additional interconnect layers, as desired) may be formed in succession on the second interconnect layer 1208 according to similar techniques and configurations described in connection with the second interconnect layer 1208 or the first interconnect layer 1206.

The IC device 1200 may include a solder resist material 1234 (e.g., polyimide or similar material) and one or more bond pads 1236 formed on the interconnect layers 1206-1210. The bond pads 1236 may be electrically coupled with the interconnect structures 1228 and configured to route the electrical signals of the transistor(s) 1240 to other external devices. For example, solder bonds may be formed on the one or more bond pads 1236 to mechanically and/or electrically couple a chip including the IC device 1200 with another component (e.g., a circuit board). The IC device 1200 may have other alternative configurations to route the electrical signals from the interconnect layers 1206-1210 than depicted in other embodiments. For example, the bond pads 1236 may be replaced by or may further include other analogous features (e.g., posts) that route the electrical signals to external components.

Figure 11:
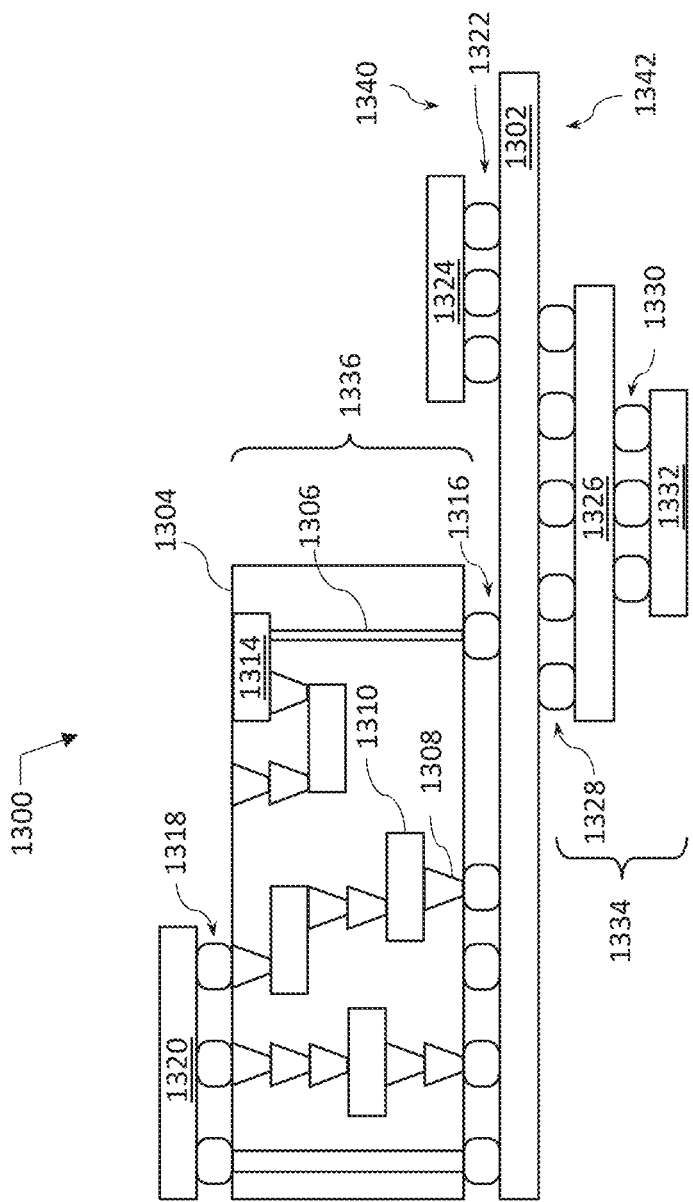
FIG. 11 is a cross-sectional side view of an IC device assembly that may include one or more IC structures with three-dimensional capacitors in accordance with any of the embodiments disclosed herein.

FIG. 11 is a cross-sectional side view of an IC device assembly 1300 that may include components having or being associated with (e.g., being electrically connected by means of) one or more IC structures with three-dimensional capacitors with double metal electrodes in accordance with any of the embodiments disclosed herein. The IC device assembly 1300 includes a number of components disposed on a circuit board 1302 (which may be, e.g., a motherboard). The IC device assembly 1300 includes components disposed on a first face 1340 of the circuit board 1302 and an opposing second face 1342 of the circuit board 1302; generally, components may be disposed on one or both faces 1340 and 1342. In particular, any suitable ones of the components of the IC device assembly 1300 may include any of the three-dimensional capacitors with double metal electrodes, disclosed herein.

In some embodiments, the circuit board 1302 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1302. In other embodiments, the circuit board 1302 may be a non-PCB substrate.

The IC device assembly 1300 illustrated in FIG. 11 includes a package-on-interposer structure 1336 coupled to the first face 1340 of the circuit board 1302 by coupling components 1316. The coupling components 1316 may electrically and mechanically couple the package-on-interposer structure 1336 to the circuit board 1302 and may include solder balls (as shown in FIG. 11), male and female portions of a socket, an adhesive, an underfill material, and/or any other suitable electrical and/or mechanical coupling structure.

The package-on-interposer structure 1336 may include an IC package 1320 coupled to an interposer 1304 by coupling components 1318. The coupling components 1318 may take any suitable form for the application, such as the forms discussed above with reference to the coupling components 1316. Although a single IC package 1320 is shown in FIG. 11, multiple IC packages may be coupled to the interposer 1304; indeed, additional interposers may be coupled to the interposer 1304. The interposer 1304 may provide an intervening substrate used to bridge the circuit board 1302 and the IC package 1320. The IC package 1320 may be or include, for example, a die (the die 1102 of FIG. 9B), an IC device (e.g., the IC device 1200 of FIG. 10), or any other suitable component. In some embodiments, the IC package 1320 may include one or more three-dimensional capacitors with double metal electrodes, as described herein. Generally, the interposer 1304 may spread a connection to a wider pitch or reroute a connection to a different connection. For example, the interposer 1304 may couple the IC package 1320 (e.g., a die) to a ball grid array (BGA) of the coupling components 1316 for coupling to the circuit board 1302. In the embodiment illustrated in FIG. 11, the IC package 1320 and the circuit board 1302 are attached to opposing sides of the interposer 1304; in other embodiments, the IC package 1320 and the circuit board 1302 may be attached to a same side of the interposer 1304. In some embodiments, three or more components may be interconnected by way of the interposer 1304.

The interposer 1304 may be formed of an epoxy resin, a fiberglass-reinforced epoxy resin, a ceramic material, or a polymer material such as polyimide. In some implementations, the interposer 1304 may be formed of alternate rigid or flexible materials that may include the same materials described above for use in a semiconductor substrate, such as silicon, germanium, and other group III-V and group IV materials. The interposer 1304 may include metal interconnects 1308 and vias 1310, including but not limited to TSVs 1306. The interposer 1304 may further include embedded devices 1314, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency (RF) devices, power amplifiers, power management devices, antennas, arrays, sensors, and microelectromechanical systems (MEMS) devices may also be formed on the interposer 1304. The interposer 1304 may further include one or more three-dimensional capacitors with double metal electrodes, as described herein. The package-on-interposer structure 1336 may take the form of any of the package-on-interposer structures known in the art.

The IC device assembly 1300 may include an IC package 1324 coupled to the first face 1340 of the circuit board 1302 by coupling components 1322. The coupling components 1322 may take the form of any of the embodiments discussed above with reference to the coupling components 1316, and the IC package 1324 may take the form of any of the embodiments discussed above with reference to the IC package 1320.

The IC device assembly 1300 illustrated in FIG. 11 includes a package-on-package structure 1334 coupled to the second face 1342 of the circuit board 1302 by coupling components 1328. The package-on-package structure 1334 may include an IC package 1326 and an IC package 1332 coupled together by coupling components 1330 such that the IC package 1326 is disposed between the circuit board 1302 and the IC package 1332. The coupling components 1328 and 1330 may take the form of any of the embodiments of the coupling components 1316 discussed above, and the IC packages 1326 and 1332 may take the form of any of the embodiments of the IC package 1320 discussed above. The package-on-package structure 1334 may be configured in accordance with any of the package-on-package structures known in the art.

Figure 12:
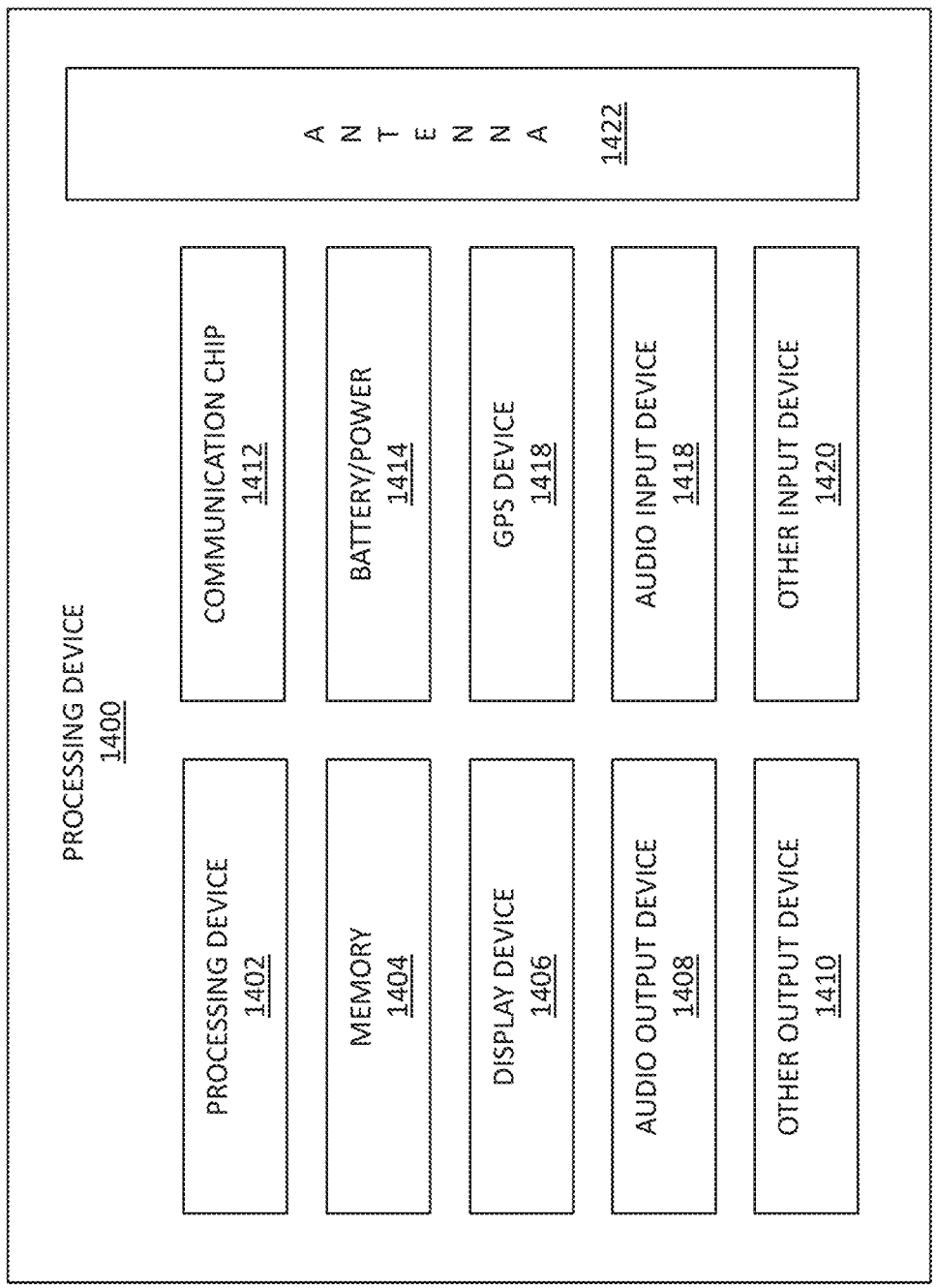
FIG. 12 is a block diagram of an example computing device that may include one or more IC structures with three-dimensional capacitors in accordance with any of the embodiments disclosed herein.

FIG. 12 is a block diagram of an example computing device 1400 that may include one or more components including one or more IC structures with one or more three-dimensional capacitors with double metal electrodes in accordance with any of the embodiments disclosed herein. For example, any suitable ones of the components of the computing device 1400 may include a die (e.g., the die 1102 of FIG. 9B) having one or more three-dimensional capacitors with double metal electrodes as described herein. Any one or more of the components of the computing device 1400 may include, or be included in, an IC device 1200

(FIG. 10). Any one or more of the components of the computing device 1400 may include, or be included in, an IC device assembly 1300 (FIG. 11).

A number of components are illustrated in FIG. 12 as included in the computing device 1400, but any one or more of these components may be omitted or duplicated, as suitable for the application. In some embodiments, some or all of the components included in the computing device 1400 may be attached to one or more motherboards. In some embodiments, some or all of these components are fabricated onto a single system-on-a-chip (SoC) die.

Additionally, in various embodiments, the computing device 1400 may not include one or more of the components illustrated in FIG. 12, but the computing device 1400 may include interface circuitry for coupling to the one or more components. For example, the computing device 1400 may not include a display device 1406, but may include display device interface circuitry (e.g., a connector and driver circuitry) to which a display device 1406 may be coupled. In another set of examples, the computing device 1400 may not include an audio input device 1424 or an audio output device 1408 but may include audio input or output device interface circuitry (e.g., connectors and supporting circuitry) to which an audio input device 1424 or audio output device 1408 may be coupled.

The computing device 1400 may include a processing device 1402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 1400 may include a memory 1404, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, the memory 1404 may include memory that shares a die with the processing device 1402. This memory may be used as cache memory and may include embedded dynamic random-access memory (eDRAM) or spin transfer torque magnetic random-access memory (STT-MRAM).

In some embodiments, the computing device 1400 may include a communication chip 1412 (e.g., one or more communication chips). For example, the communication chip 1412 may be configured for managing wireless communications for the transfer of data to and from the computing device 1400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1412 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 1412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1412 may operate in accordance with other wireless protocols in other embodiments. The computing device 1400 may include an antenna 1422 to facilitate wireless communications and/or to receive other wireless communications (such as AM or FM radio transmissions).

In some embodiments, the communication chip 1412 may manage wired communications, such as electrical, optical, or any other suitable communication protocols (e.g., the Ethernet). As noted above, the communication chip 1412 may include multiple communication chips. For instance, a first communication chip 1412 may be dedicated to shorter-range wireless communications such as Wi-Fi or Bluetooth, and a second communication chip 1412 may be dedicated to longer-range wireless communications such as GPS, EDGE, GPRS, CDMA, WiMAX, LTE, EV-DO, or others. In some embodiments, a first communication chip 1412 may be dedicated to wireless communications, and a second communication chip 1412 may be dedicated to wired communications.

The computing device 1400 may include battery/power circuitry 1414. The battery/power circuitry 1414 may include one or more energy storage devices (e.g., batteries or capacitors) and/or circuitry for coupling components of the computing device 1400 to an energy source separate from the computing device 1400 (e.g., AC line power).

The computing device 1400 may include a display device 1406 (or corresponding interface circuitry, as discussed above). The display device 1406 may include any visual indicators, such as a heads-up display, a computer monitor, a projector, a touchscreen display, a liquid crystal display (LCD), a light-emitting diode display, or a flat panel display, for example.

The computing device 1400 may include an audio output device 1408 (or corresponding interface circuitry, as discussed above). The audio output device 1408 may include any device that generates an audible indicator, such as speakers, headsets, or earbuds, for example.

The computing device 1400 may include an audio input device 1424 (or corresponding interface circuitry, as discussed above). The audio input device 1424 may include any device that generates a signal representative of a sound, such as microphones, microphone arrays, or digital instruments (e.g., instruments having a musical instrument digital interface (MIDI) output).

The computing device 1400 may include a global positioning system (GPS) device 1418 (or corresponding interface circuitry, as discussed above). The GPS device 1418 may be in communication with a satellite-based system and may receive a location of the computing device 1400, as known in the art.

The computing device 1400 may include an other output device 1410 (or corresponding interface circuitry, as discussed above). Examples of the other output device 1410 may include an audio codec, a video codec, a printer, a wired or wireless transmitter for providing information to other devices, or an additional storage device.

The computing device 1400 may include an other input device 1420 (or corresponding interface circuitry, as discussed above). Examples of the other input device 1420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 1400 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 1400 may be any other electronic device that processes data.

SELECT EXAMPLES

The following paragraphs provide various examples of the embodiments disclosed herein.

Example 1 provides an IC device that includes a support structure and a capacitor. The support structure has a first face (e.g., a bottom face) and a second face (e.g., a top face) opposite the first face, and the support structure has an opening extending from the second face towards, but not reaching, the first face of the support structure. The capacitor has a first capacitor electrode (e.g., including both a thin layer that extends into the opening and a thick layer along the top face), a second capacitor electrode (e.g., including both a thin layer that extends into the opening and a thick layer along the top face), and a capacitor insulator between the first capacitor electrode and the second capacitor electrode. A first portion of the first capacitor electrode (e.g., the thin layer in the opening) extends along an inner wall of the opening of the support structure, and the first portion of the first capacitor electrode has a thickness between 1 nm and 5 nm. A second portion of the first capacitor electrode (e.g., a thin layer along the top and the thick layer) extends along at least a portion of the second face (e.g., top) of the support structure, and the second portion of the first capacitor electrode has a thickness between 10 nm and 100 nm. A first portion of the capacitor insulator (e.g., a portion in the opening) is nested within the first portion of the first capacitor electrode, and a second portion of the capacitor insulator (e.g., a portion along the top face) is layered over the second portion of the first capacitor electrode. A first portion of the second capacitor electrode (e.g., the thin layer in the opening) is nested within the first portion of the capacitor insulator, and the first portion of the second capacitor electrode has a thickness between 1 nm and 5 nm. A second portion of the second capacitor electrode (e.g., a thin layer along the top and the thick layer) is layered over the second portion of the capacitor insulator, and the second portion of the second capacitor electrode has a thickness between 10 nm and 100 nm.

Example 2 provides the IC device of example 1, further including a first electrode contact coupled to the first capacitor electrode, where the first electrode contact is in contact with the second portion of the first capacitor electrode; and a second electrode contact electrically coupled to the second capacitor electrode, where the second electrode contact in contact with the second portion of the first capacitor electrode.

Example 3 provides the IC device of example 1 or 2, where the first capacitor electrode includes a first conductive layer and a second conductive layer, the first conductive layer thinner than the second conductive layer.

Example 4 provides the IC device of example 3, where the first conductive layer includes the first portion of the first capacitor electrode (e.g., the portion extending into the opening) and a first layer of the second portion of the first capacitor electrode (the thin layer along the top).

Example 5 provides the IC device of example 4, where the second conductive layer includes a second layer of the second portion of the first capacitor electrode (e.g., the thick layer along the top).

Example 6 provides the IC device according to any of examples 3-5, where the second capacitor electrode includes a third conductive layer and a fourth conductive layer, the third conductive layer thinner than the fourth conductive layer.

Example 7 provides the IC device according to example 6, where the third conductive layer includes the first portion of the second capacitor electrode (e.g., the portion inside the opening), and a second layer of the second portion of the second capacitor electrode (e.g., the thin layer along the top).

Example 8 provides the IC device according to any of the preceding examples, where the first portion of the first capacitor electrode has a thickness between 1 nm and 5 nm, the second portion of the first capacitor electrode has a thickness between 10 nm and 100 nm, the first portion of the second capacitor electrode has a thickness between 1 nm and 5 nm, and the second portion of the second capacitor electrode has a thickness between 10 nm and 100 nm. The capacitor insulator may have a thickness between 1 nm and 5 nm.

Example 9 provides the IC device according to any of the preceding examples, the IC device further including a transistor coupled to the capacitor, where the transistor and the capacitor are included in a memory cell.

Example 10 provides the IC device according to any of the preceding examples, the capacitor further including a third capacitor electrode and a second capacitor insulator between the second capacitor electrode and the third capacitor electrode.

Example 11 provides the IC device according to example 10, where a first portion of the second capacitor insulator is nested within the first portion of the second capacitor electrode, and a first portion of the third capacitor electrode is nested within the first portion of the second capacitor electrode.

Example 12 provides the IC device according to example 11, where a second portion of the second capacitor insulator is layered over the second portion of the second capacitor electrode, and a second portion of the third capacitor electrode is layered over the second portion of the second capacitor insulator.

Example 13 provides the IC device according to example 12, where the second portion of the first capacitor electrode and the second portion of the third capacitor electrode are electrically coupled to a first electrode contact, and the second portion of the second capacitor electrode is electrically coupled to a second electrode contact.

Example 14 provides the IC device according to example 12, where the second portion of the first capacitor electrode is electrically coupled to a first electrode contact, the second portion of the second capacitor electrode is electrically coupled to a second electrode contact, and the second portion of the third capacitor electrode is electrically coupled to a third electrode contact.

Example 15 provides an IC device that includes a support structure and a capacitor. The support structure has a first face (e.g., a bottom face) and a second face (e.g., a top face) opposite the first face, and the support structure has an array of openings, each opening extending from the second face towards, but not reaching, the first face of the support structure, where each opening has an inner wall. The capacitor includes a first conductive layer that has a first array of conductive via portions extending along the inner walls of the array of openings, and a planar portion extending along the second face (e.g., the top) of the support structure, where the planar portion of the first conductive layer electrically connects the first array of conductive via portions. The capacitor further includes an insulator layer that has an array of insulating via portions nested within the first array of conductive via portions, and a planar portion extending parallel to the second face (e.g., the top) of the support structure. The capacitor further includes a second conductive layer that has a second array of conductive via portions nested within the array of insulating via portions, and a planar portion extending parallel to the second face (e.g., top) of the support structure, where the planar portion of the second conductive layer electrically connects the second array of conductive via portions.

Example 16 provides the IC device according to example 15, further including a third conductive layer extending along the planar portion of the first conductive layer, the third conductive layer thicker than the first conductive layer.

Example 17 provides the IC device according to example 16, where the third conductive layer has a thickness between 10 nm and 100 nm, and the first conductive layer has a thickness between 1 nm and 5 nm.

Example 18 provides the IC device according to example 16 or 17, further including a fourth conductive layer extending along the planar portion of the second conductive layer, the fourth conductive layer thicker than the second conductive layer.

Example 19 provides the IC device according to example 18, where the fourth conductive layer has a thickness between 10 nm and 100 nm, and the second conductive layer has a thickness between 1 nm and 5 nm.

Example 20 provides the IC device according to any of examples 15-19, where neighboring openings in the array have a pitch between 50 nm and 500 nm.

Example 21 provides the IC device of according to any of examples 15-20, where an opening in the array has a diameter between 50 nm and 500 nm.

Example 22 provides the IC device according to any of examples 15-21, where the capacitor further includes a second insulator layer that has a second array of insulating via portions nested within the second array of conductive via portions, and a planar portion extending parallel to the second face of the support structure; and a third conductive layer that has a third array of conductive via portions nested within the second array of insulating via portions, and a planar portion extending parallel to the second face of the support structure.

Example 23 provides the IC device according to example 22, where the first conductive layer and the third conductive layer are electrically coupled to a first electrode contact, and the second conductive layer is electrically coupled to a second electrode contact.

Example 24 provides the IC device according to example 22, where the first conductive layer is electrically coupled to a first electrode contact, the second conductive layer is electrically coupled to a second electrode contact, and the third conductive layer is electrically coupled to a third electrode contact.

Example 25 provides the IC device according to any of examples 15-24, where the capacitor is a decoupling capacitor.

Example 26 provides a method for fabricating an IC structure, the method including: forming, in a support structure, an array of via openings; forming, using a first deposition method, a first capacitor electrode layer over the support structure and in the array of via openings; forming, using a second deposition method, a second capacitor electrode layer over the first capacitor electrode layer; forming an insulator layer over the second capacitor electrode layer and in the array of via openings; forming, using the first deposition method, a third capacitor electrode layer over the insulator layer and in the array of via openings; and forming, using the second deposition method, a fourth capacitor electrode layer over the third capacitor electrode layer.

Example 27 provides the method according to example 26, further including forming a first electrode contact for the first capacitor electrode; and forming a second capacitor electrode for the second capacitor electrode.

Example 28 provides the method according to example 26 or 27, where the first deposition method is atomic layer deposition (ALD).

Example 29 provides the method according to any of examples 26-28, where the second deposition method is magnetron sputtering.

Example 30 provides an IC package that includes an IC die, including one or more of the memory/IC devices according to any one of the preceding examples. The IC package may also include a further component, coupled to the IC die.

Example 31 provides the IC package according to example 30, where the further component is one of a package substrate, a flexible substrate, or an interposer.

Example 32 provides the IC package according to examples 30 or 31, where the further component is coupled to the IC die via one or more first level interconnects.

Example 33 provides the IC package according to example 23, where the one or more first level interconnects include one or more solder bumps, solder posts, or bond wires.

Example 34 provides a computing device that includes a circuit board; and an IC die coupled to the circuit board, where the IC die includes one or more of the memory/IC devices according to any one of the preceding examples (e.g., memory/IC devices according to any one of examples 1-20), and/or the IC die is included in the IC package according to any one of the preceding examples (e.g., the IC package according to any one of examples 30-33).

Example 35 provides the computing device according to example 34, where the computing device is a wearable computing device (e.g., a smart watch) or hand-held computing device (e.g., a mobile phone).

Example 36 provides the computing device according to examples 34 or 35, where the computing device is a server processor.

Example 37 provides the computing device according to examples 34 or 35, where the computing device is a motherboard.

Example 38 provides the computing device according to any one of examples 34-37, where the computing device further includes one or more communication chips and an antenna.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) device, comprising:
   a support structure having a first face, a second face opposite the first face, and an opening extending from the second face towards, but not reaching, the first face; and
   a capacitor having a first capacitor electrode, a second capacitor electrode, and a capacitor insulator between the first capacitor electrode and the second capacitor electrode, wherein:
      a first portion of the first capacitor electrode extends along an inner wall of the opening, and a second portion of the first capacitor electrode extends along at least a portion of the second face of the support structure;
      a first portion of the capacitor insulator is nested within the first portion of the first capacitor electrode, and a second portion of the capacitor insulator is layered over the second portion of the first capacitor electrode; and
      a first portion of the second capacitor electrode is nested within the first portion of the capacitor insulator, and a second portion of the second capacitor electrode is layered over the second portion of the capacitor insulator.

2. The IC device according to claim 1, further comprising a first electrode contact electrically coupled to the first capacitor electrode, the first electrode contact in contact with the second portion of the first capacitor electrode, and a second electrode contact electrically coupled to the second capacitor electrode, the second electrode contact in contact with the second portion of the first capacitor electrode.

3. The IC device according to claim 1, wherein the first capacitor electrode comprises a first conductive layer and a second conductive layer, the first conductive layer thinner than the second conductive layer.

4. The IC device according to claim 3, the first conductive layer comprising:
   the first portion of the first capacitor electrode; and
   a first layer of the second portion of the first capacitor electrode.

5. The IC device according to claim 4, the second conductive layer comprising a second layer of the second portion of the first capacitor electrode.

6. The IC device according to claim 3, wherein the second capacitor electrode comprises a third conductive layer and a fourth conductive layer, the third conductive layer thinner than the fourth conductive layer.

7. The IC device according to claim 6, the third conductive layer comprising:
   the first portion of the second capacitor electrode; and
   a second layer of the second portion of the second capacitor electrode.

8. The IC device according to claim 1, wherein the first portion of the first capacitor electrode has a thickness between 1 nm and 5 nm, the second portion of the first capacitor electrode has a thickness between 10 nm and 100 nm, the first portion of the second capacitor electrode has a thickness between 1 nm and 5 nm, and the second portion of the second capacitor electrode has a thickness between 10 nm and 100 nm.

9. The IC device according to claim 1, further comprising a transistor coupled to the capacitor, where the transistor and the capacitor are included in a memory cell.

10. The IC device according to claim 1, the capacitor further comprising a third capacitor electrode and a second capacitor insulator between the second capacitor electrode and the third capacitor electrode.

11. The IC device according to claim 10, wherein a first portion of the second capacitor insulator is nested within the first portion of the second capacitor electrode, and a first portion of the third capacitor electrode is nested within the first portion of the second capacitor electrode.

12. An integrated circuit (IC) device, comprising:
   a support structure having a first face and a second face opposite the first face, the support structure having an array of openings, each opening extending from the second face towards, but not reaching, the first face of the support structure, and each opening having an inner wall; and
   a capacitor comprising:
      a first conductive layer comprising a first array of conductive via portions extending along the inner walls of the array of openings, and a planar portion extending along the second face of the support structure, the planar portion of the first conductive layer electrically connecting the first array of conductive via portions;
      an insulator layer comprising an array of insulating via portions nested within the first array of conductive via portions, and a planar portion extending parallel to the second face of the support structure; and
      a second conductive layer comprising a second array of conductive via portions nested within the array of insulating via portions, and a planar portion extending parallel to the second face of the support structure, the planar portion of the second conductive layer electrically connecting the second array of conductive via portions.

13. The IC device of claim 12, wherein neighboring openings in the array have a pitch between 50 nm and 500 nm.

14. The IC device of claim 12, wherein an opening in the array has a diameter between 50 nm and 500 nm.

15. The IC device of claim 12, the capacitor further comprising:
- a second insulator layer comprising a second array of insulating via portions nested within the second array of conductive via portions, and a planar portion extending parallel to the second face of the support structure; and
- a third conductive layer comprising a third array of conductive via portions nested within the second array of insulating via portions, and a planar portion extending parallel to the second face of the support structure.

16. The IC device according to claim 15, wherein the first conductive layer and the third conductive layer are electrically coupled to a first electrode contact, and the second conductive layer is electrically coupled to a second electrode contact.

17. The IC device according to claim 15, wherein the first conductive layer is electrically coupled to a first electrode contact, the second conductive layer is electrically coupled to a second electrode contact, and the third conductive layer is electrically coupled to a third electrode contact.

18. The IC device according to claim 12, wherein the capacitor is a decoupling capacitor.

19. A method for fabricating an integrated circuit (IC) structure, the method comprising:
- forming, in a support structure, an array of via openings;
- forming, using a first deposition method, a first capacitor electrode layer over the support structure and in the array of via openings;
- forming, using a second deposition method, a second capacitor electrode layer over the first capacitor electrode layer;
- forming an insulator layer over the second capacitor electrode layer and in the array of via openings;
- forming, using the first deposition method, a third capacitor electrode layer over the insulator layer and in the array of via openings;
- forming, using the second deposition method, a fourth capacitor electrode layer over the third capacitor electrode layer.

20. The method according to claim 19, further comprising:
- forming a first electrode contact for the first capacitor electrode; and
- forming a second capacitor electrode for the second capacitor electrode.

* * * * *